United States Patent
Kondo et al.

(10) Patent No.: US 8,644,057 B2
(45) Date of Patent: Feb. 4, 2014

(54) MAGNETIC MEMORY AND MAGNETIC MEMORY APPARATUS

(75) Inventors: Tsuyoshi Kondo, Kanagawa-ken (JP); Hirofumi Morise, Kanagawa-ken (JP); Shiho Nakamura, Kanagawa-ken (JP); Yoshinari Kurosaki, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 315 days.

(21) Appl. No.: 13/235,664

(22) Filed: Sep. 19, 2011

(65) Prior Publication Data
US 2012/0224416 A1    Sep. 6, 2012

(30) Foreign Application Priority Data

Mar. 4, 2011  (JP) ................ P2011-048105

(51) Int. Cl.
*G11C 11/00*    (2006.01)
(52) U.S. Cl.
USPC ........................... 365/158; 365/143; 365/63
(58) Field of Classification Search
USPC ................................. 365/158, 148
See application file for complete search history.

(56) References Cited

U.S. PATENT DOCUMENTS

| | | | |
|---|---|---|---|
| 8,004,881 B2 * | 8/2011 | Zhu et al. ...................... | 365/158 |
| 8,422,278 B2 * | 4/2013 | Xi et al. ....................... | 365/158 |
| 2009/0016098 A1 | 1/2009 | Wunderlich et al. | |
| 2009/0052237 A1 * | 2/2009 | Morise et al. ................. | 365/171 |

FOREIGN PATENT DOCUMENTS

| | | |
|---|---|---|
| JP | 2006-156840 | 6/2006 |
| JP | 2010-166054 | 7/2010 |

OTHER PUBLICATIONS

Ohno, H., et al., "Electric-field control of ferromagnetism" Letters to Nature, vol. 408, Dec. 2000, pp. 944-946.
Nozaki, T., et al., "Voltage-induced perpendicular magnetic anisotropy change in magnetic tunnel injections", Applied Physics Letters, 96, 2010, 022506-1.

* cited by examiner

*Primary Examiner* — Anthan Tran
(74) *Attorney, Agent, or Firm* — Turocy & Watson, LLP

(57) ABSTRACT

A magnetic memory includes a first magnetic layer, a second magnetic layer, a third magnetic layer, a first intermediate layer, a second intermediate layer, an insulator film, and an electrode. The third magnetic layer is provided between the first magnetic layer and the second magnetic layer in a first direction being perpendicular to the plane of both the first magnetic layer and the second magnetic layer. The insulator film is provided on the third magnetic layer in a second direction perpendicular to the first direction. The electrode is provided on the insulator film so that the insulator is sandwiched between the third magnetic layer and the electrode in the second direction. In addition, a positive voltage is applied to the electrode and a first current passes from the first magnetic layer to the second magnetic layer, thereby writing information to the second magnetic layer.

10 Claims, 23 Drawing Sheets

FIRST MAGNETIC MEMORY i-th MAGNETIC MEMORY

10th MAGNETIC MEMORY

US 8,644,057 B2

MAGNETIC MEMORY AND MAGNETIC MEMORY APPARATUS

CROSS REFERENCE TO RELATED APPLICATION

This application is based upon and claims the benefit of priority from a prior Japanese Patent Application No. 2011-048105, filed on Mar. 4, 2011, the entire contents of which are incorporated herein by reference.

FIELD

Embodiments relate basically to a magnetic memory and a magnetic memory apparatus.

BACKGROUND

Magnetic random access memory (MRAM) is one of various memories. MRAM uses ferromagnetic material for part for memorizing information in which a magnetization direction, can be controlled with external signals, indicates data, thereby enabling long-term storage of the information. There are several kinds of MRAM's, for which one can apply magnetic field or injects spin-polarized current to switch magnetization for recording. Nowadays, typical MRAM uses the current to control the magnetization. Therefore, the current to pass through a circuit increases in proportion to an amount of information to be recorded.

BRIEF DESCRIPTION OF DRAWINGS

Aspects of this disclosure will become apparent upon reading the following detailed description and upon reference to accompanying drawings. The description and the associated drawings are provided to illustrate embodiments of the invention and not limited to the scope of the invention.

DESCRIPTION

Figure 1A:
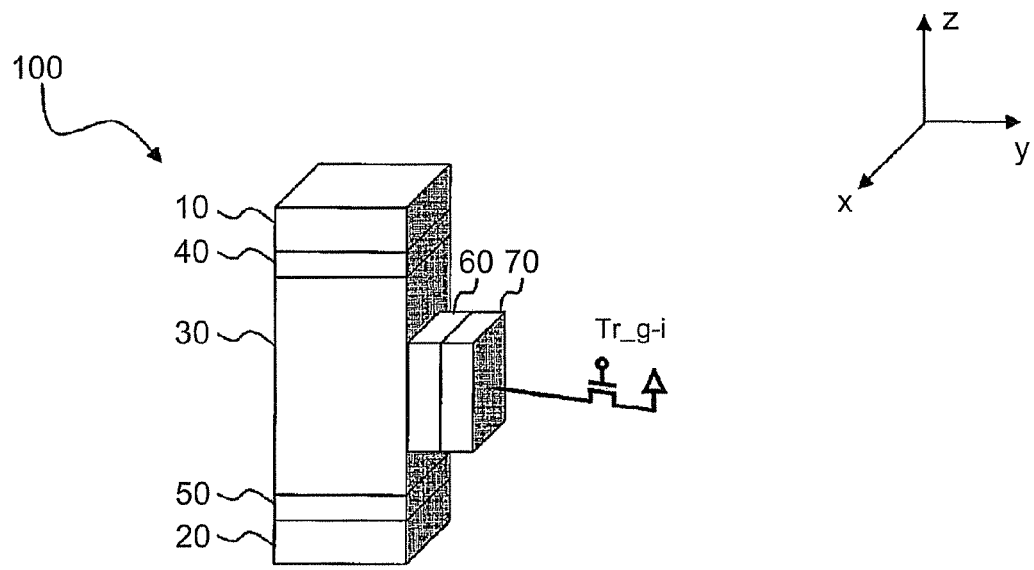
FIG. 1A is a view showing a magnetic memory in accordance with a first embodiment.

Embodiments will be described below with reference to drawings. Wherever possible, the same reference numerals or marks will be used to denote the same or like portions throughout figures. The drawings are conceptual. Therefore, a relationship between the thickness and width of each portion and a proportionality factor among the respective portions are not necessarily the same as an actual thing. Even when the same portions are drawn, their sizes or proportionality factors may be represented differently from each other with respect to the drawings.

As will be described below, according to an embodiment, a magnetic memory includes a first magnetic layer, a second magnetic layer, a third magnetic layer, a first intermediate layer, a second intermediate layer, an insulator film, and an electrode. The third magnetic layer is provided between the first magnetic layer and the second magnetic layer in a first direction being perpendicular to the plane of both the first magnetic layer and the second magnetic layer. The first intermediate layer is provided between the first magnetic layer and the third magnetic layer. The second intermediate layer is provided between the second magnetic layer and the third magnetic layer. The insulator film is provided on the third magnetic layer in a second direction perpendicular to the first direction. The electrode is provided on the insulator film so that the insulator is sandwiched between the third magnetic layer and the electrode in the second direction. A positive voltage is applied to the electrode and a first current passes from the first magnetic layer to the second magnetic layer, thereby writing information to the second magnetic layer.

According to another embodiment, a magnetic memory includes a first magnetic layer, a second magnetic layer, a third magnetic layer, a first intermediate layer, a second intermediate layer, an insulator film, and an electrode. The third magnetic layer is provided between the first magnetic layer and the second magnetic layer in a first direction being perpendicular to the plane of both the first magnetic layer and the second magnetic layer. The first intermediate layer is provided between the first magnetic layer and the third magnetic layer. The second intermediate layer is provided between the second magnetic layer and the third magnetic layer. The insulator film is provided on the third magnetic layer in a second direction perpendicular to the first direction. The electrode is provided on the insulator film so that the insulator is sandwiched between the third magnetic layer and the electrode in the second direction. A negative voltage is applied to the electrode and a first current passes from the first magnetic layer to the second magnetic layer, or a positive voltage is applied to the electrode and a second current passes from the first magnetic layer to the second magnetic layer, thereby reading data stored in the second magnetic layer. The second current is smaller than the first current.

First Embodiment

FIG. 1A is a view showing a magnetic memory 100.

The magnetic memory 100 comprises a first magnetic layer 10, a first intermediate layer 40, a third magnetic layer 30, a second intermediate layer 50, a second magnetic layer 20, an insulator film 60, and an electrode 70.

Here, as shown in FIG. 1A, the x-axis, the y-axis, and the z-axis are at right angles to each other. The z-axis shows a lamination direction. The x-axis and y-axis show a direction perpendicular to the lamination direction.

The first magnetic layer 10, the first intermediate layer 40, the third magnetic layer 30, the second intermediate layer 50, and the second magnetic layer 20 are laminated in the z-axis direction. As used herein, "laminate" has the same meaning of "deposit".

The insulator film 60 is formed on a sidewall of the third magnetic layer 30 in the y-axis direction. The electrode 70 is formed on the insulator film 60 so that the insulator film 60 is sandwiched between the electrode 70 and the sidewall. A drain terminal of a transistor Tr_g-i to switch a current is connected to the electrode 70.

The first magnetic layer 10, the second magnetic layer 20, and the third magnetic layer 30 are ferromagnetic or ferrimagnetic. It is possible to employ an alloy containing at least one element selected from the group consisting of iron (Fe), cobalt (Co), nickel (Ni), manganese (Mn), chromium (Cr) and at least one element selected from the group consisting of platinum (Pt), palladium (Pd), iridium (Ir), a ruthenium (Ru), and rhodium (Rh) for these magnetic layers. Examples of the alloys include CoPt, NiFe, and CoCrPt for the ferromagnetic materials. The characteristics of the materials can be modified by changing compositions thereof or heat treatments thereto.

The ferrimagnetic materials include amorphous alloys of rare earth elements and transition metals, e.g., TbFeCo, and GdFeCo. These materials can be a sputtered film whose magnetization tends to be easily oriented in the z-axis direction, and the sputtered film can be employed as a perpendicular magnetization film.

If multi-layered structures such as Co/Pt, Co/Pd, and Co/Ni are employed as material systems for the first magnetic layer, the second magnetic layer and the third magnetic layer, the magnetization of these layers can be oriented in the z-axis direction. The multi-layered structures tend to show <0001> orientation of a hexagonal close-packed structure or <111> orientation of a face centered cubic structure.

The magnetization of the first magnetic layer 10 is fixed. Moreover, the magnetization of the first magnetic layer 10 is oriented in the lamination direction. The film thickness of the first magnetic layer 10 is not less than 10 nm and not more than 50 nm. The first magnetic layer 10 forces the magnetization of the third magnetic layer 30 to be oriented in the magnetization direction of the first magnetic layer 10 via the first intermediate layer 40.

The magnetization of the second magnetic layer 20 is weakly fixed in contrast with the magnetizations of the first magnetic layer 10 and the magnetization of the third magnetic layer 30. For this reason, the magnetization of the second magnetic layer 20 can rotate freely to some extent (also referred to as "variable"). Moreover, the magnetization of the second magnetic layer 20 is oriented in the lamination direction. The film thickness of the second magnetic layer 20 is not less than 2 nm and not more than 10 nm.

The magnetization of the third magnetic layer 30 is fixed. Moreover, the magnetization of the third magnetic layer 30 is oriented in a direction perpendicular to the lamination direction. The film thickness of the third magnetic layer 30 is not less than 10 nm and not more than 50 nm.

The third magnetic layer 30 preferably has a larger dumping factor than that of the second magnetic layer 20 so that the magnetization direction of the third magnetic layer 30 is not changed by a spin torque to arise when a current passes through the magnetic memory 100.

Magnetization precession is retarded strongly in a magnetic material having a large dumping factor. Therefore, time for the magnetization reversal of the such magnetic material due to spin torque becomes longer.

The first intermediate layer 40 provided between the first magnetic layer 10 and the third magnetic layer 30 results in exchange-coupling therebetween. Due to the existence of the first intermediate layer 40, the magnetization directions of the first magnetic layer 10 and the third magnetic layer 30 can be independent each other. It is possible to employ a nonmagnetic metal for the intermediate layer 40. It is possible to employ at least one element selected from the group consisting of silver (Ag), copper (Cu), a ruthenium (Ru), rhodium (Rh), and iridium (Ir) for the first intermediate layer 40 for the nonmagnetic metal, for example. Alternatively, these elements may be alloyed to use. The film thickness of the first intermediate layer 40 is not less than 1 nm and not more than 30 nm.

The second intermediate layer 50 prevents the second magnetic layer 20 and the third magnetic layer 30 from being magnetically coupled directly with each other. A conducting material or an insulating material can be employed for the second intermediate layer 50. It is possible to employ at least one element selected from the group consisting of copper (Cu), gold (Au), silver (Ag), and aluminum (Al) for the conducting material, for example. These elements may be alloyed to use. In this case, the film thickness of the second intermediate layer 50 is not less than 1.5 nm and not more than 20 nm. Also in this case, a GMR (Giant Magnetoresistance) effect is observed between the second magnetic layer 20 and the third magnetic layer 30. Examples of the insulating material include an oxide, a nitride, a fluoride, and an oxynitride. All of them contain at least one element selected from the group consisting of Aluminum (Al), titanium (Ti), zinc (Zn), zirconium (Zr), tantalum (Ta), cobalt (Co), nickel (Ni), silicon (Si), magnesium (Mg), and iron (Fe), for example. Specifically, an aluminum oxide ($Al_2O_3$) can be employed for the insulating material, for example. The examples of the insulating material also include wide-gap semiconductors AlAs, GaN, MN, ZnSe, and ZnO. In this case, the film thickness of the second intermediate layer 50 is not less than 0.2 nm and not more than 2.0 nm. Also in this case, a TMR (Tunnel Magnetroresistance) effect is observed between the second magnetic layer 20 and the third magnetic layer 30.

An oxide, a nitride, a fluoride, and an oxynitride can be employed as material of the insulator film 60. All of them contain at least one element selected from the group consisting of Aluminum (Al), titanium (Ti), zinc (Zn), zirconium (Zr), tantalum (Ta), cobalt (Co), nickel (Ni), silicon (Si), magnesium (Mg), and iron (Fe), for example. Specifically, a magnesium oxide (MgO) can be employed for the material of the insulator film 60, for example. The permittivity of insulator film 60 should be as large as possible, preferably. This is to make it easy to distribute charges between the third magnetic layer 30 and the electrode 70 when a voltage is applied to the electrode 70. When the same material is used for the second intermediate layer 50 and the insulator film 60, a layer including one of platinum (Pt), palladium (Pd), iridium (Ir), a ruthenium (Ru) and rhodium (Rh), or an alloyed layer of these is provided between the third magnetic layer 30 and the insulator film 60. In this case, the layer is an atomic monolayer or an atomic bi-layer in thickness. In this way, it is possible to lower a voltage to switch the magnetization of the third magnetic layer 30.

Figure 1B:
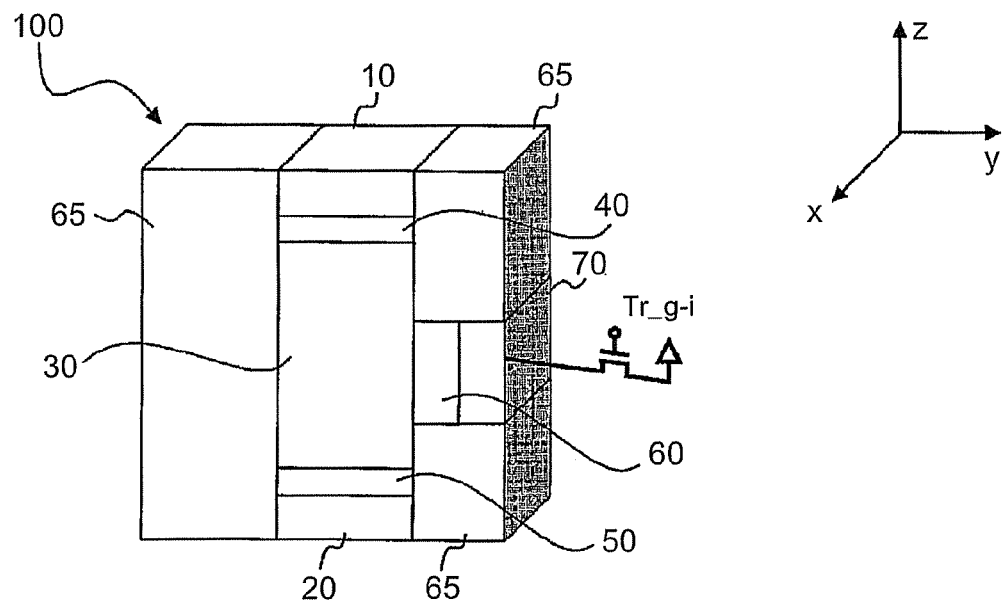
FIG. 1B is a view showing another magnetic memory in accordance with the first embodiment.

Alternatively, the magnetic memory 100 may be provided with an insulator 65 as shown in FIG. 1B. In the y-axis direction, the insulator 65 forms to be in contact with the first magnetic layer 10, the first intermediate layer 40, the third magnetic layer 30, the second intermediate layer 50, and the second magnetic layer 20. Moreover, the insulator 65 is also in contact with the insulator film 60 and the electrode 70 in the z-axis direction. In this structure, permittivity of the insulator film 60 is larger than that of the insulator 65. This is to easily distribute charges near between the third magnetic layer 30 and the electrode 70 when a voltage is applied to the electrode 70.

Next, an operating principle of the magnetic memory 100 will be explained.

Firstly, a writing operation of the magnetic memory 100 will be explained.

Figure 2:
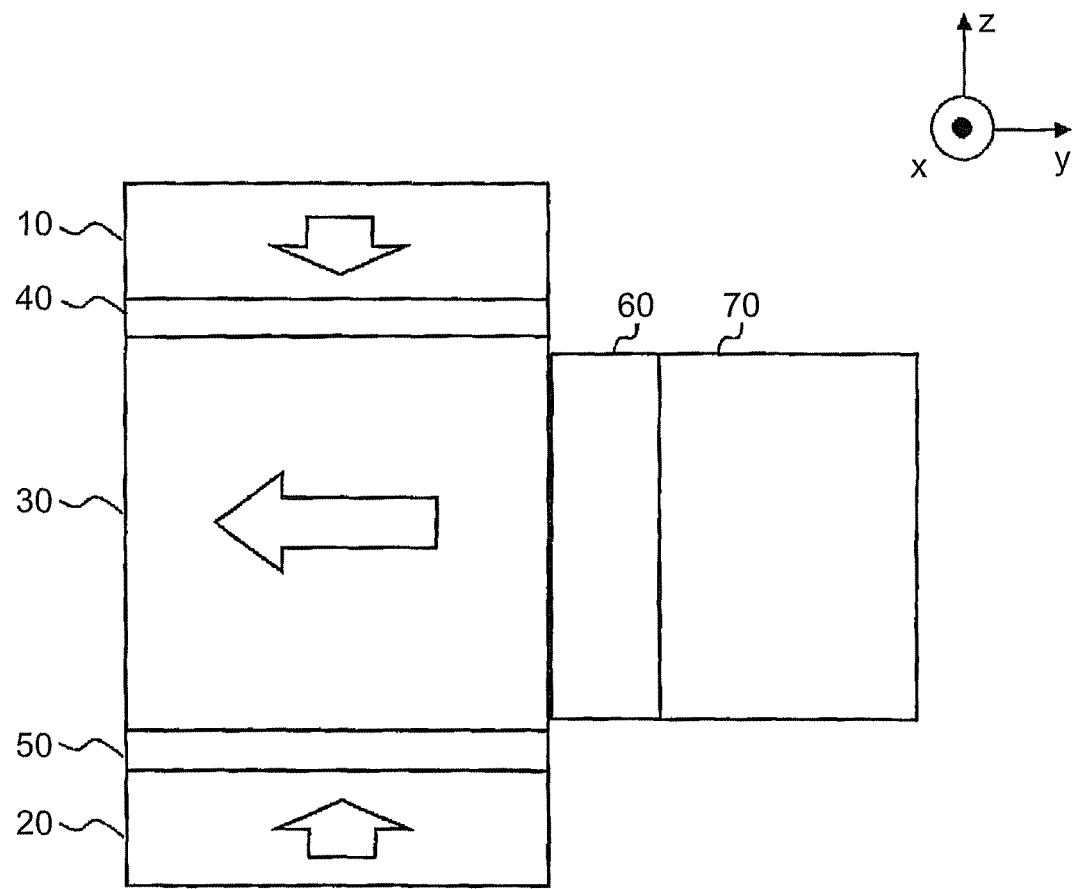
FIG. 2 is a view showing the magnetic memory in a condition without applied voltage any current passing through it, in accordance with the first embodiment.

FIG. 2 is a view showing a condition (equilibrium condition) in which any voltage is not applied and any current does not pass through the magnetic memory 100. The arrows shown in the first magnetic layer 10, the second magnetic layer 20, and the third magnetic layer 30 indicate the magnetization directions thereof. The magnetization direction of the first magnetic layer 10 is downward on the plane of paper (referred to simply as "downward" hereinafter). The magnetization direction of the second magnetic layer 20 is upward on the plane of paper (referred to simply as "upward" hereinafter). The magnetization direction of the third magnetic layer 30 is leftward on the plane of paper (referred to simply as "leftward" hereinafter). Data stored in the magnetic memory 100 will be treated as '1' if the magnetization direction of the second magnetic layer 20 is upward, and will be treated as '0' if the magnetization direction of the second magnetic layer 20 is downward. Writing operation is performed by reversing the magnetization of the second magnetic layer 20. The magnetization direction of the second magnetic layer 20 is reversed by passing a current from the first magnetic layer 10 to the third magnetic layer 30 or by passing a current from the third magnetic layer 30 to the first magnetic layer 10. However, when the magnetization of the third magnetic layer 30 does not tilt (referred to as an equilibrium condition), the magnetization of the second magnetic layer 20 is hard to reverse. This is for the following reason. If an angle between the third magnetic layer 30 and the second magnetic layer 20 is close to 90°, spin torque is small.

Figure 3:
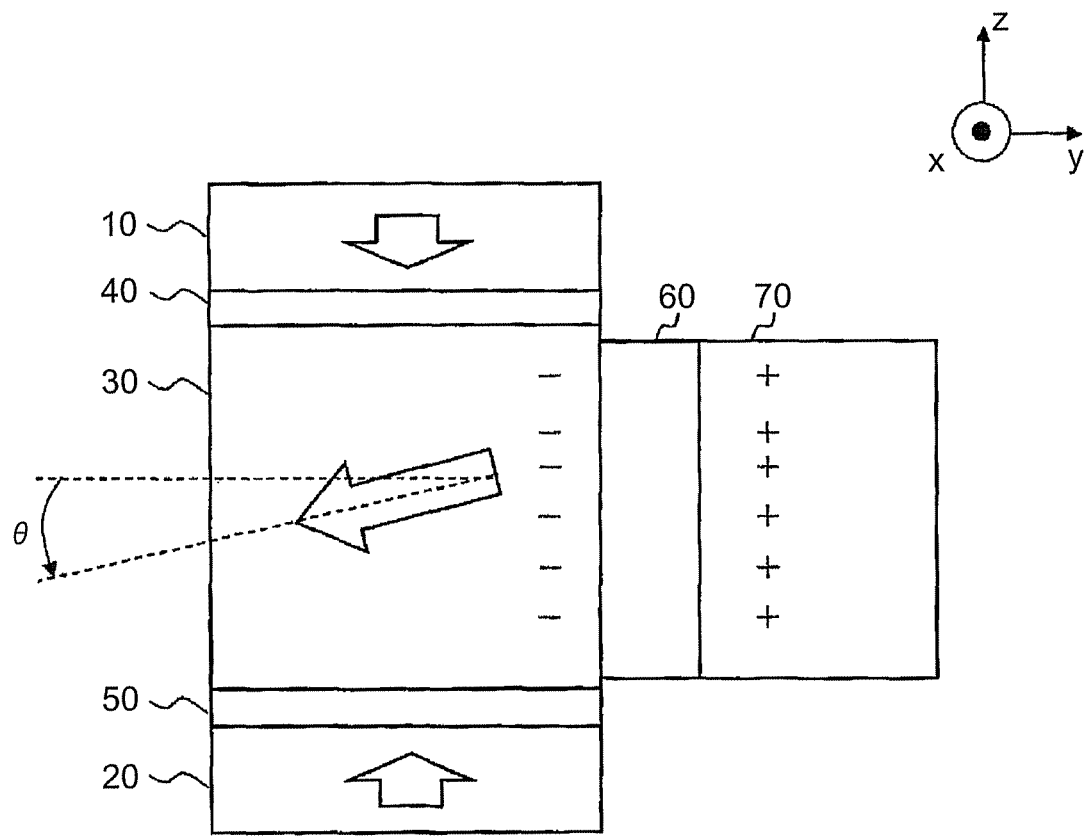
FIG. 3 is a view showing the magnetic memory in a condition with an applied voltage, in accordance with the first embodiment.
Figure 4A:
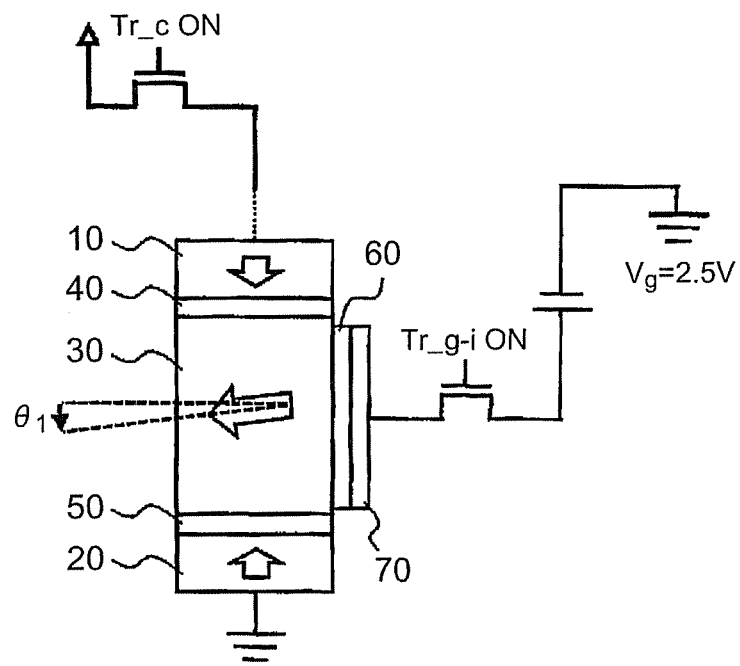
FIGS. 4A and 4B are views showing magnetization reversal of a second magnetic layer induced by an applied voltage changing from 2.5V to 5V.
Figure 4B:
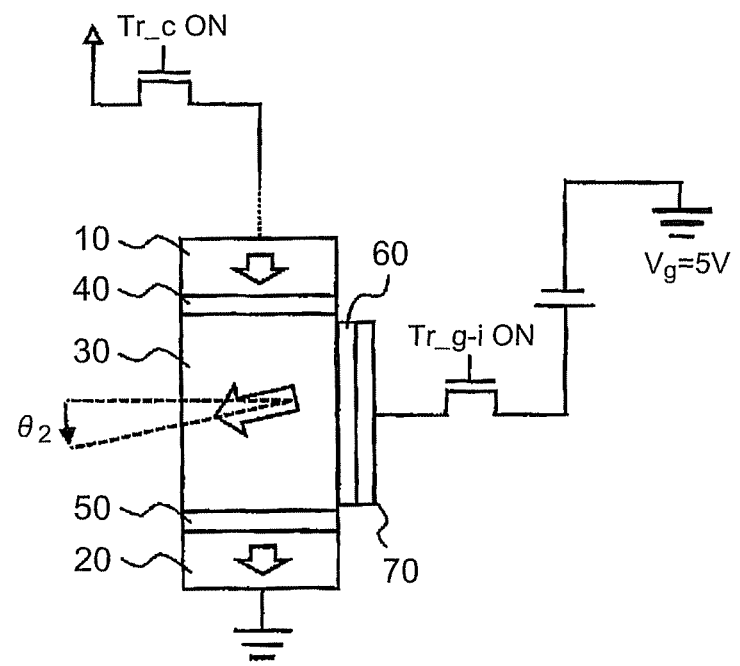

A voltage Vg (Vg>0V) is applied between the third magnetic layer 30 and the electrode 70 so that the potential of the electrode 70 becomes higher than that of the third magnetic layer 30. the voltage Vg tilts the magnetization of the third magnetic layer 30 toward the downward direction. The following mechanism is considered to explain this behavior. A portion of electric charges in the third magnetic layer 30 moves to the interface between the third magnetic layer 30 and the insulator film 60 as shown in FIG. 3 (as negative charges), thereby reducing the force limiting the magnetization direction of the third magnetic layer 30. As a result, the magnetization of the third magnetic layer 30 is easily influenced by the magnetization of the first magnetic layer 10. The tilt angle of the magnetization on the third magnetic layer 30 can be controlled by changing the voltage Vg. FIGS. 4A and 4B are views showing that the magnetization of the second magnetic layer 20 has been reversed when the applied voltage Vg is changed from 2.5V to 5V. When Vg=2.5V and Vg=5V (shown in FIGS. 4A and 4B, respectively), the tilt angles of the magnetization of the third magnetic layer 30 are denoted as $\theta 1$ and $\theta 2$, respectively. $\theta 1$ is smaller than $\theta 2$.

In this manner, a voltage applied to the electrode 70, to tilt the magnetization of the third magnetic layer 30, and passing a current through the second magnetic layer 20 reverse the magnetization of the second magnetic layer 20. The tilt angle of the magnetization of the third magnetic layer 30 increases with increasing the voltage Vg applied to the electrode 70, thereby allowing it to shorten reversal time of the magnetization of the second magnetic layer 20.

A reading operation of the magnetic memory 100 will be explained.

Reading operation is realized by detecting a resistance change when a current passes between the first magnetic layer 10 and the second magnetic layer 20. The amount of resistance change depends on a relative angle between the magnetization of the second magnetic layer 20 and the magnetization of the third magnetic layer 30. In the equilibrium condition, the magnetization of the second magnetic layer 20 and the magnetization of the third magnetic layer 30 are at right angles to each other. For this reason, the resistance of the magnetic memory 100 does not change whichever the magnetization direction of second magnetic layer is upward or downward.

Figures 5A, 5B:
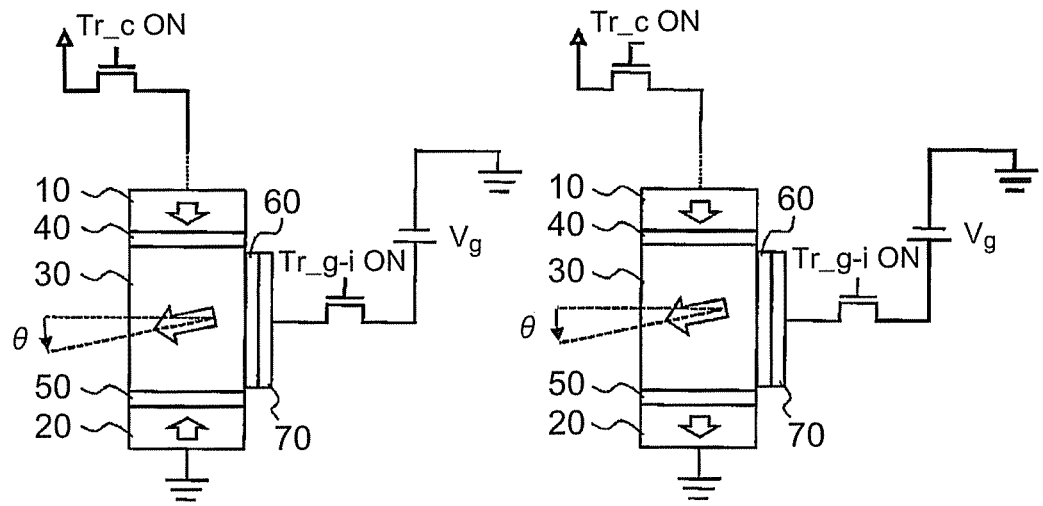
FIGS. 5A and 5B are views showing cases in which magnetization directions of the second magnetic layer are upward and downward, respectively.
Figure 5C:
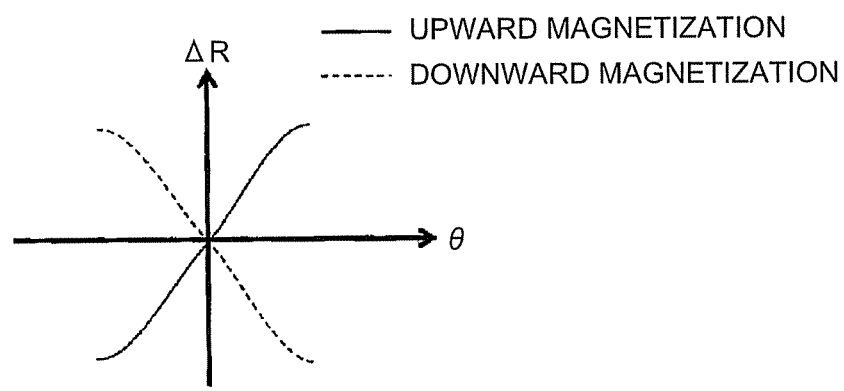
FIG. 5C is a schematic view showing a relation between a tilt angle θ of magnetization of a third magnetic layer and a resistance change ΔR of the magnetic memory in accordance with the first embodiment.

A voltage Vg (Vg>0V) is applied between the third magnetic layer 30 and the electrode 70 so that the electrode 70 has higher potential than the third magnetic layer 30. The voltage Vg tilts the magnetization of the third magnetic layer 30, thereby changing the relative angle between the magnetization of the second magnetic layer 20 and the magnetization of the third magnetic layer 30. The resistance changes with the relative angle, thereby allowing it to perform the reading operation of the magnetic memory 100. FIGS. 5A and 5B are views showing cases in which magnetization directions of the second magnetic layer 20 are upward and downward, respectively. FIG. 5C is a schematic view showing a relation between a tilt angle $\theta$ of the magnetization of the third magnetic layer 30 and a resistance change $\Delta R$ of the magnetic memory 100. In FIG. 5C, the solid line shows a case where the magnetization direction of the second magnetic layer 20 is upward as shown in FIG. 5A. In FIG. 5C, the dotted line shows a case where the magnetization direction of the second magnetic layer 20 is downward as shown in FIG. 5B. It should be noted that ΔR increases with increasing θ when the magnetization direction of the second magnetic layer 20 is upward. In contrast, when the magnetization direction of the second magnetic layer 20 is downward, ΔR decreases with increasing θ. Therefore, a current passes through the magnetic memory 100 with tilting the magnetization of the third magnetic layer 30, thereby allowing it to detect the magnetization direction of the second magnetic layer 20, i.e., to perform reading operation.

A reading current passing through the magnetic memory 100 is smaller than a writing current passing therethrough. Alternatively, during the reading operation, a voltage can be applied, which is reverse of a for writing operation. That is, when the write voltage is positive, the read voltage is negative.

First Modification

Figure 6A:
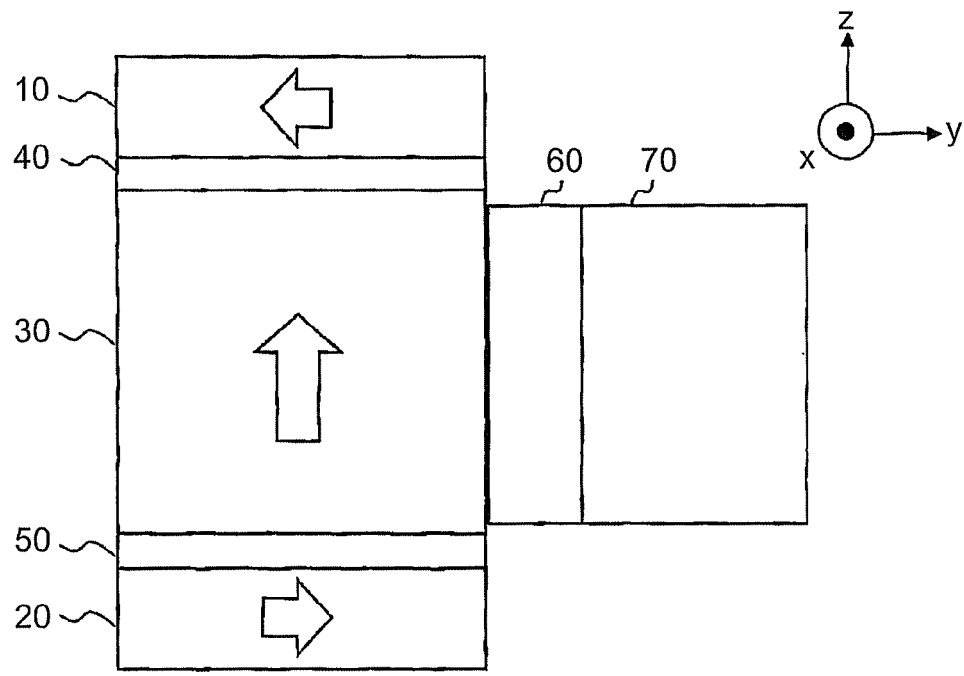
FIGS. 6A and 6B are views showing a first modification of the magnetic memory in accordance with the first embodiment.
Figure 6B:
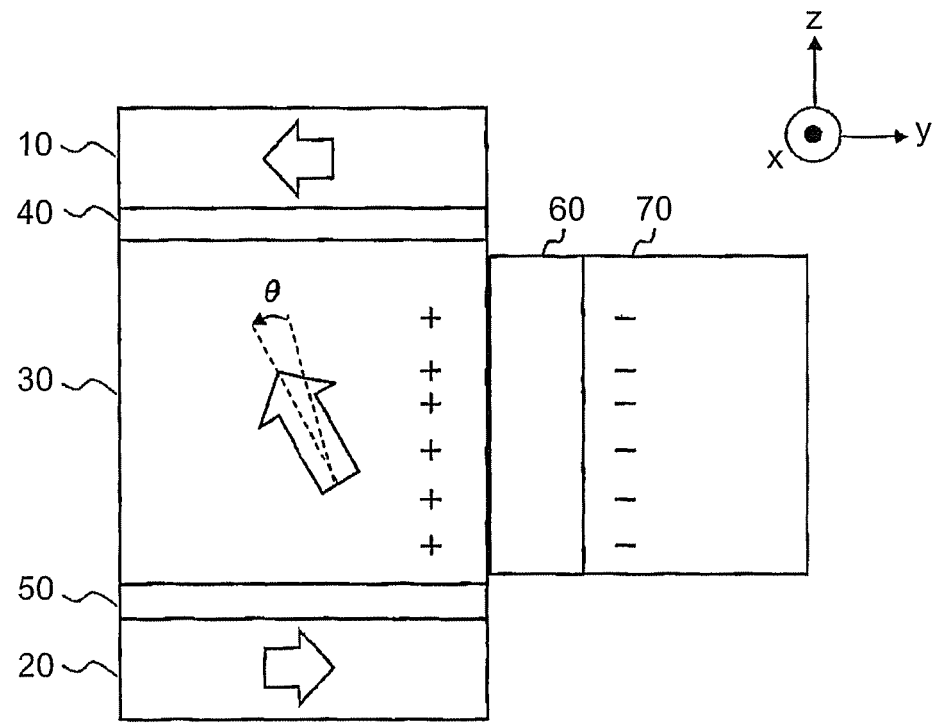

FIGS. 6A and 6B are views showing a first modification of the magnetic memory 100. The magnetization of the first magnetic layer 10 is leftward. The magnetization of the second magnetic layer 20 is rightward on the plane of the paper (referred to simply as "rightward" hereinafter). The magnetization of the third magnetic layer 30 is upward. FIG. 6A is a view showing an equilibrium condition of the first modification. FIG. 6B is a view showing a condition of the modification where a voltage Vg (Vg<0V) is applied between the third magnetic layer 30 and the electrode 70 so that the third magnetic layer 30 has higher electrical potential than the electrode 70. The voltage Vg applied to the electrode 70 reduces the force limiting the magnetization of the third magnetic layer 30. As a result, the magnetization orientation of the third magnetic layer 30 is influenced to tilt by that of the first magnetic layer 10.

Second Modification

Figure 7:
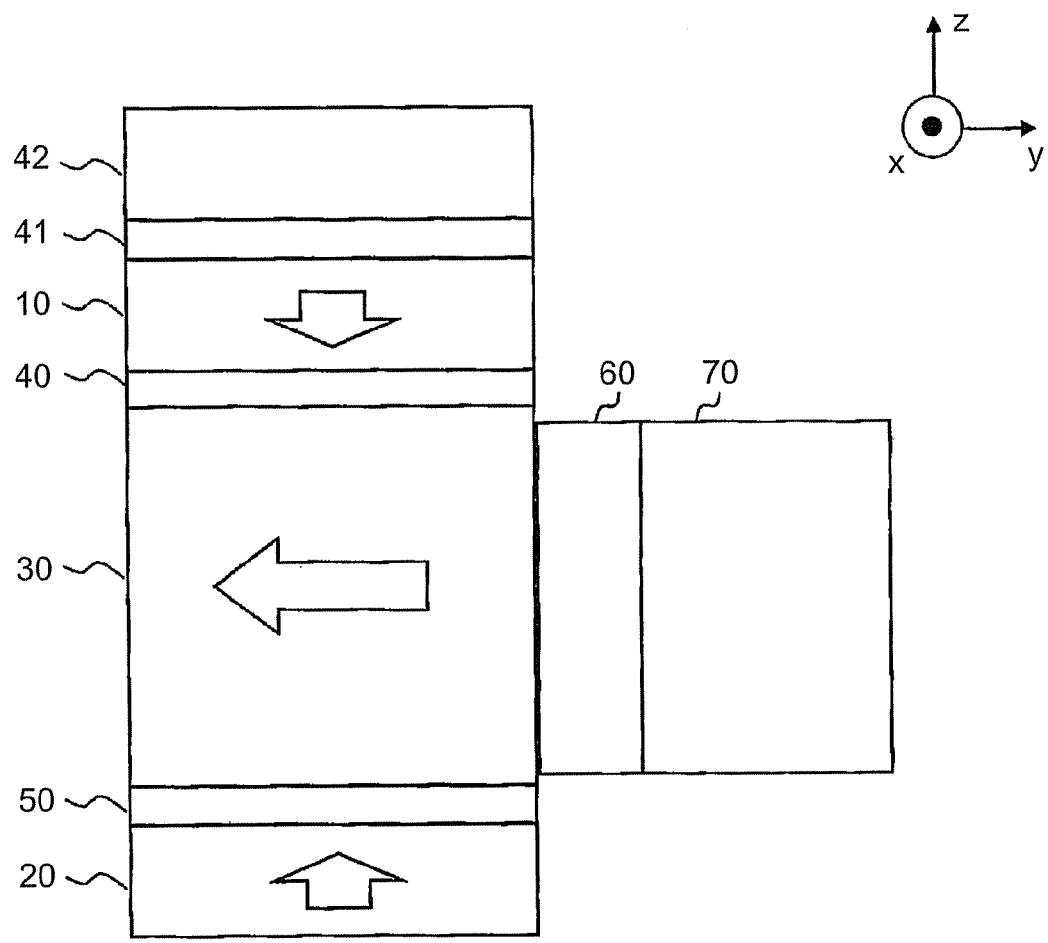
FIG. 7 is a view showing a second modification of the magnetic memory in accordance with the first embodiment.

FIG. 7 is a view showing a second modification of the magnetic memory 100. The third intermediate layer 41 is provided on the first magnetic layer 10. The fourth magnetic layer 42 is provided on the third intermediate layer 41.

The third intermediate layer 41 includes Ru. The fourth magnetic layer 42 is an antiferromagnetic layer comprising the materials like IrMn. Therefore, preparing both the third intermediate layer 41 and the fourth magnetic layer 42 allows it to fix the magnetization of the first magnetic layer 10 more strongly.

Third Modification

Figure 8:
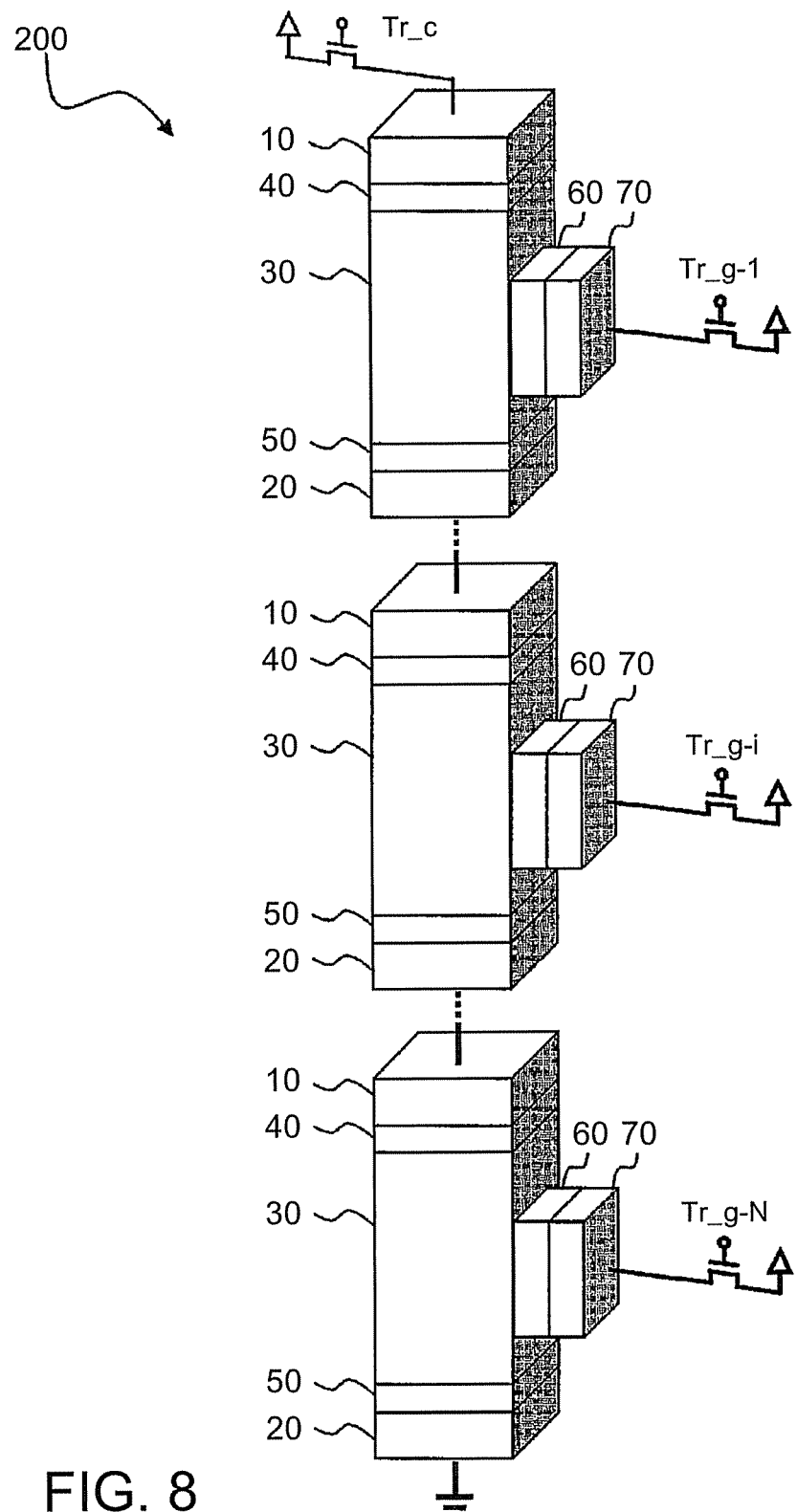
FIG. 8 is a view showing a third modification of the magnetic memory in accordance with the first embodiment.

FIG. 8 is a view showing a third modification of the magnetic memory 100. Two or more magnetic memories 100 are connected in series to provide a magnetic memory apparatus 200. The magnetic memories 100 are connected to each other with metal leads. These magnetic memories 100 are numbered as being the first memory, . . . , the i-th memory, . . . , the N-th memory from the top to the bottom in FIG. 8. N and i are natural numbers to satisfy 1<i<N. N denotes the last magnetic memory 100 at the bottom end. The first magnetic layer 10 of the first magnetic memory 100 is connected to the source terminal or the drain terminal of the transistor Tr_C with a metal lead. An electrode 70 of each magnetic memory 100 is connected to the source terminal or drain terminal of a transistor Tr_g. The second magnetic layer 20 of the N-th magnetic memory 100 is connected to the common terminal of an external circuit (not shown) with a metal lead.

When two or more magnetic memory apparatuses 200 are arranged to be used as a recording system, the transistor Tr_g_i connected to the electrode 70 of the i-th magnetic memory 100 of each magnetic memory apparatus 200 can be used as a common transistor. As a result, the magnetic memory apparatus 200 can simplify interconnections of the external circuit.

Second Embodiment

A manufacturing method of the magnetic memory 100 will be explained.

Figure 9:
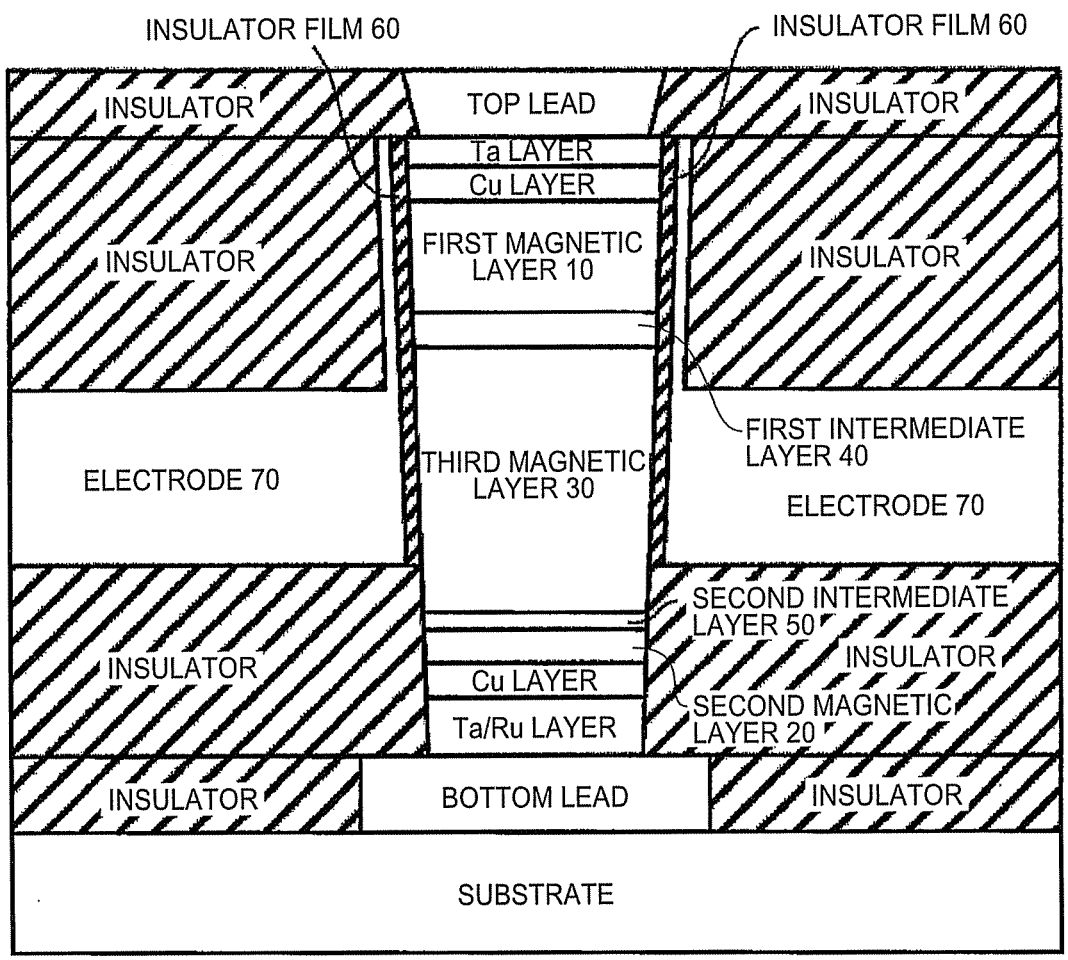
FIG. 9 is a view showing a magnetic memory in accordance with a second embodiment.

As shown in FIG. 9, the magnetic memory 100 is provided with a metal multilayer film to serve as an electrode between a bottom lead and the second magnetic layer 20. A Ta layer, a Ru layer, and a Cu layer are provided on the bottom lead. A metal multilayer film is provided also between a top lead and the first magnetic layer 10. A Cu layer and a Ta layer are provided on the first magnetic layer 10.

The magnetic memory 100 shown in FIG. 9 is manufactured as follows.

Figure 10:
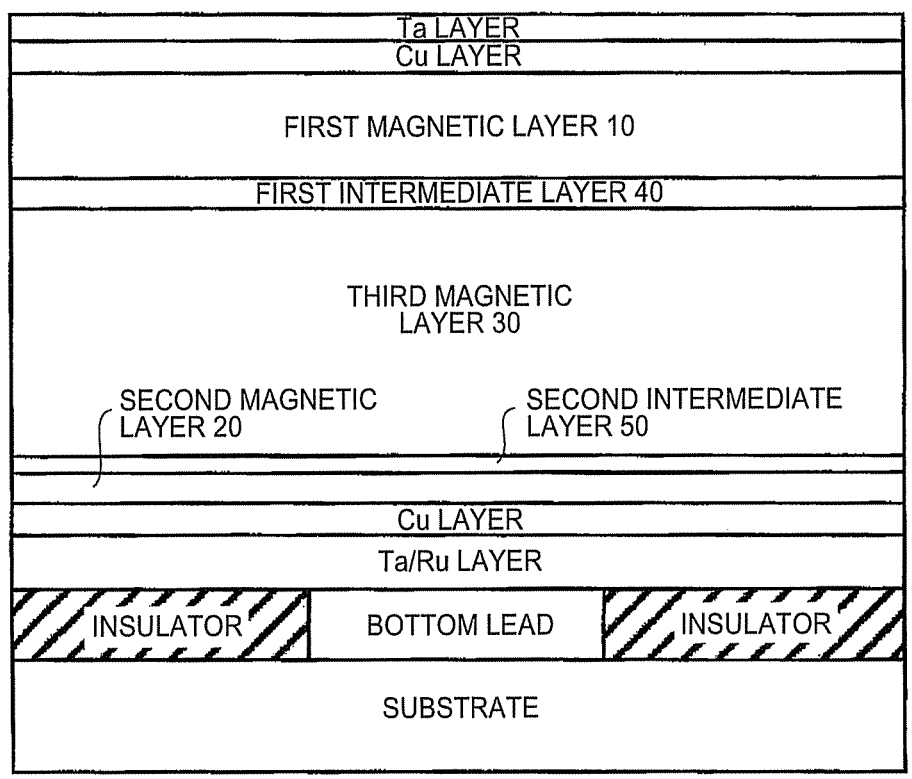
FIG. 10 is a view showing a laminated structure of the magnetic memory in accordance with the second embodiment.

First, an insulator is laminated on a substrate and a portion of a surface of the substrate is exposed to air by etching the insulator using a mask. A bottom lead is embedded into the exposed portion. Next, a Ta layer, a Ru layer, a Cu layer, the second magnetic layer 20, the second intermediate layer 50, the third magnetic layer 30, the first intermediate layer 40, the first magnetic layer 10, a Cu layer, and a Ta layer are laminated on both the bottom lead and the insulator in this order using a ultrahigh-vacuum (UHV) sputtering system (FIG. 10).

Figure 11:
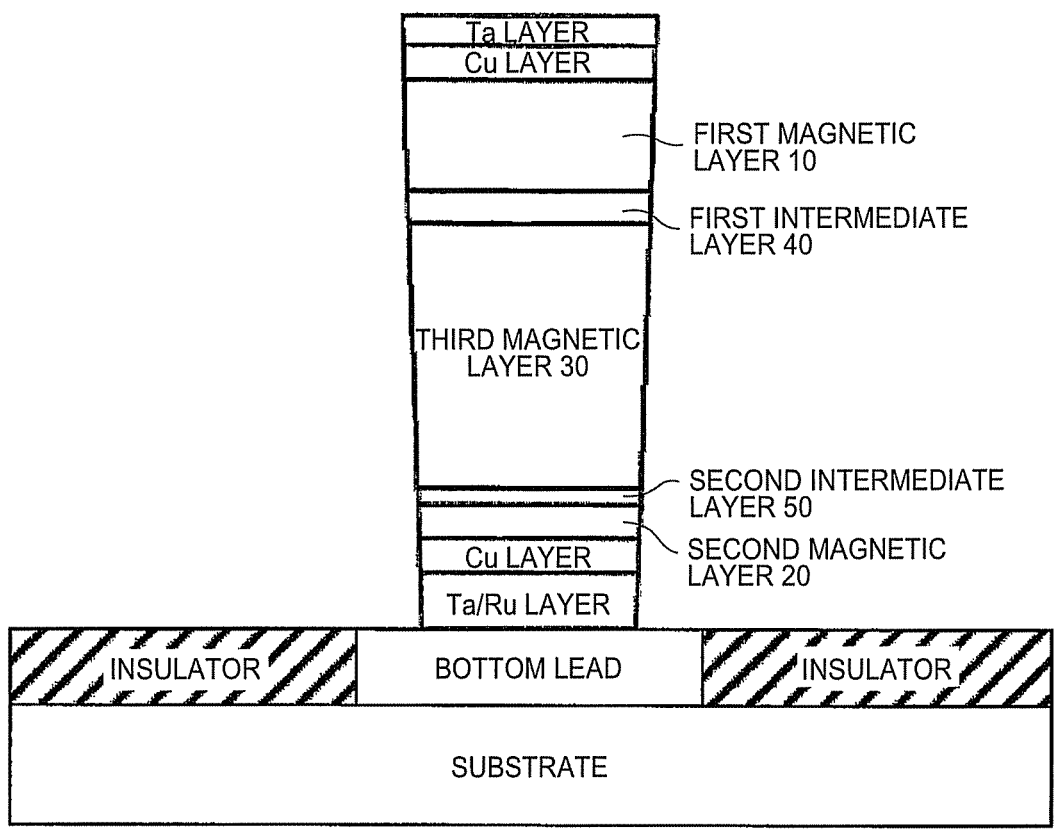
FIG. 11 is a view showing a processed structure of the magnetic memory in accordance with the second embodiment.

Next, the laminated structure is coated with a negative resist. Only the laminated structure provided on the bottom lead is exposed using EB exposure equipment. Then, the pattern, in which the portion of the resist on the bottom lead is left, is developed. The laminated structure is etched by ion milling using the resist pattern. At this time, the structure laminated on the bottom lead is tapered with a specific conditions of the ion milling process. And then, the resist pattern is removed (FIG. 11).

Figure 12:
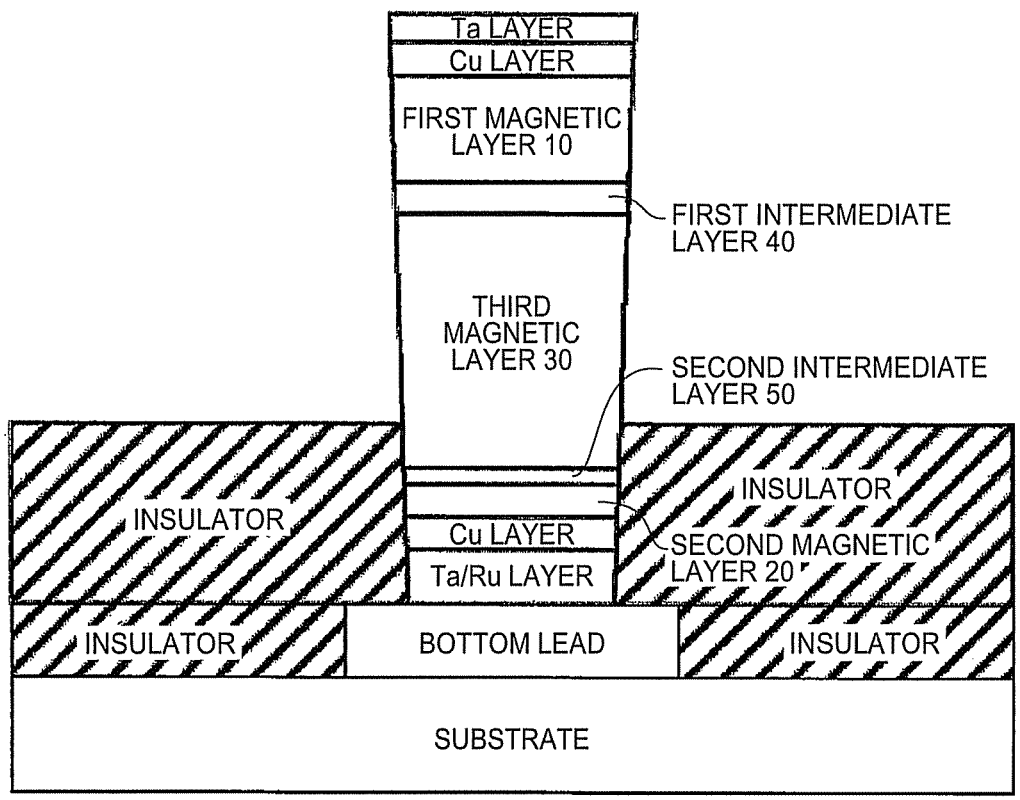
FIG. 12 is a view showing a processed structure of the magnetic memory in accordance with the second embodiment.
Figure 13:
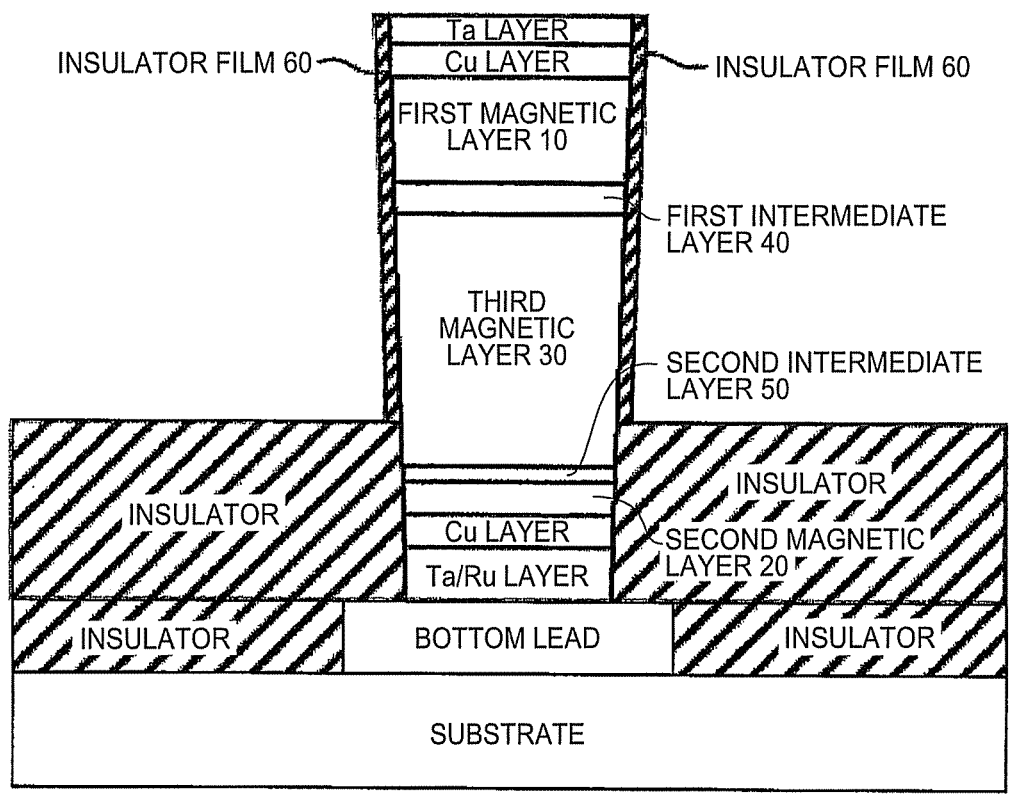
FIG. 13 is a view showing a processed structure of the magnetic memory in accordance with the second embodiment.

Next, an insulator is laminated on the Ta top layer and on the insulator in contact with the bottom lead using an UHV sputtering system. After the structure undergoes chemical mechanical polishing (CMP) for planarization, the insulator is etched by reactive ion etching using the Ta layer as a mask so that the top surface of the insulator is located lower than that of the third magnetic layer 30 (FIG. 12).

Next, after removing some compounds on the side wall of the laminated structure on the bottom lead by ion milling, a sample having the laminated structure, which has been sealed with an inert gas, is carried into an atomic layer deposition system. An insulator film 60 is deposited on the side wall of the laminated structure on the bottom lead.

Figure 14:
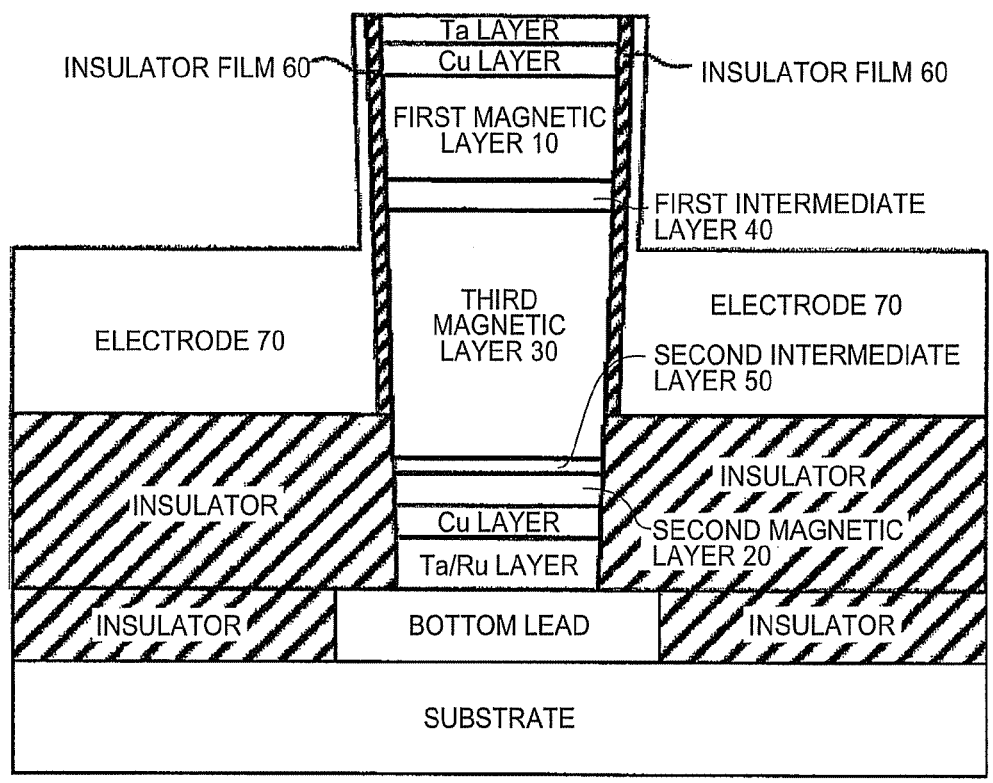
FIG. 14 is a view showing a processed structure of the magnetic memory in accordance with the second embodiment.

Next, a metal layer to be used as the electrode 70 is deposited on the Ta layer, the insulator, and the insulator film 60 using an UHV sputtering system. And a negative resist is left only on the Ta layer. The metal layer is etched by ion milling using the negative resist left as a pattern on the Ta layer so that the top surface of the metal layer is located around the upper portion of the third magnetic layer 30. Then, the negative resist is removed. Next, a positive resist is spread on the Ta layer, the insulator film 60, and the metal layer. The positive resist is exposed to UV light using a KrF photolithography machine to transfer a pattern to the positive resist and is developed so that the magnetic memory 100 and the peripheral interconnections are coated with the pattern of the positive resist. Then, a portion excepting the pattern of the positive resist is removed by ion milling. As shown in FIG. 14, a portion of the electrode 70 is often left on the side wall of the first intermediate layer 40 and the first magnetic layer, unintentionally. Even in such a case, the anisotropy energy of the first magnetic layer 10 is so large that a voltage applied to the first magnetic layer 10 does not cause any problems to the operation of the magnetic memory 100.

Next, an insulator is deposited entirely on the wafer including the magnetic memories using an UHV sputtering system. The deposition process is followed by chemical mechanical polishing (CMP) for planarization. Finally, the surface of the Ta layer is exposed to air using EB exposure equipment and ion milling. Subsequently, a metal layer is deposited on the Ta layer as the top lead using an UHV sputtering system to provide the leads using a KrF photolithography machine and by ion milling. A contact area of the top lead is made to be smaller than the surface area of the Ta layer, thereby allowing it to prevent an electrical short circuit between the electrode 70 and the top lead.

FIRST EXAMPLE

The magnetic memory 100 was simulated on the basis of numerical analysis.

In the initial condition, the magnetization directions of the first magnetic layer 10, the second magnetic layer 20, and the third magnetic layer 30 are downward in the z-axis direction, upward in the z-axis direction, and substantially perpendicular to the z-axis direction, respectively.

The third magnetic layer 30 has magnetic anisotropy whose magnetization easy axis is in the z-axis direction. The magnetic anisotropy originates from the magnetic properties of the material of the third magnetic layer 30 and the shape of the magnetic memory 100. The magnitude of the magnetic anisotropy is $1 \times 10^4$ J/m$^3$. The first magnetic layer 10 gives exchange bias to the third magnetic layer 30 via the first intermediate layer 40. The exchange bias is equivalent to magnetostatic energy of $0.5 \times 10^3$ J/m$^3$ and tilts the magnetization of the third magnetic layer 30 downward from a direction perpendicular to the z-axis only by a small angle of 1°. When a voltage is applied between the electrode 70 and the third magnetic layer 30 (grounded), the magnetic anisotropy of the third magnetic layer 30 changes at a rate of $1.5 \times 10^3$ J/m$^3$/V, of which easy axis is in a direction perpendicular to the z-axis.

The second magnetic layer 20 is 3 nm in thickness, and has uniaxial magnetic anisotropy of which magnetization easy axis is in the z-axis. The anisotropy energy, the magnetization, and the damping constant of the second magnetic layer 20 are $4.8 \times 10^5$ J/m$^3$, 800 emu/cc, and 0.007, respectively. A spin polarization rate of the current passing between the second magnetic layer and the third magnetic layers is assumed to be 50% in the simulation.

Figure 15:
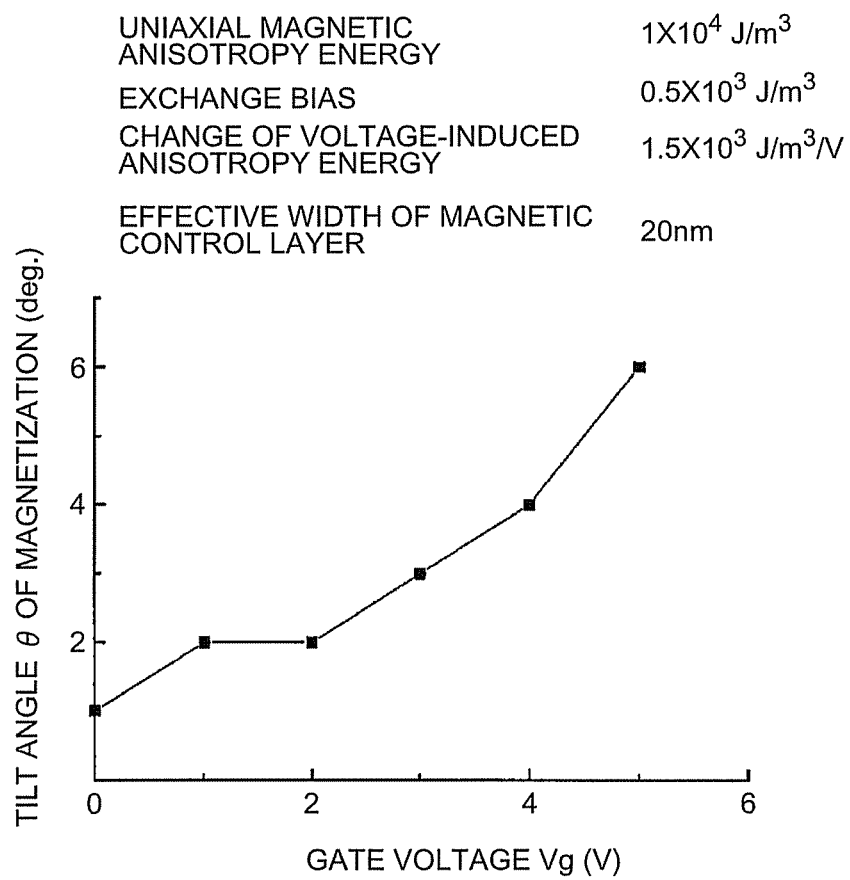
FIG. 15 is a graph showing a simulation result on the relationship between tilted angles of the magnetization of the third magnetic layer and gate voltage Vg.

FIG. 15 is a graph showing a simulation for a tilt angle of the magnetization of the third magnetic layer 30 and a gate voltage Vg (Vg>0V). The voltage Vg is applied between the third magnetic layer 30 and the electrode 70 so that the electrode 70 has higher electrical potential than the third magnetic layer 30. The horizontal axis denotes the gate voltage Vg (V) and the vertical axis denotes the tilt angle θ of the magnetization of the third magnetic layer 30.

As shown in FIG. 15, the tilt angle θ of the magnetization of the third magnetic layer 30 increases with increasing the applied voltage Vg. For example, when a voltage of 5V is applied to the electrode 70, the tilt angle θ of the magnetization is shown to be θ~6°.

Figure 16A:
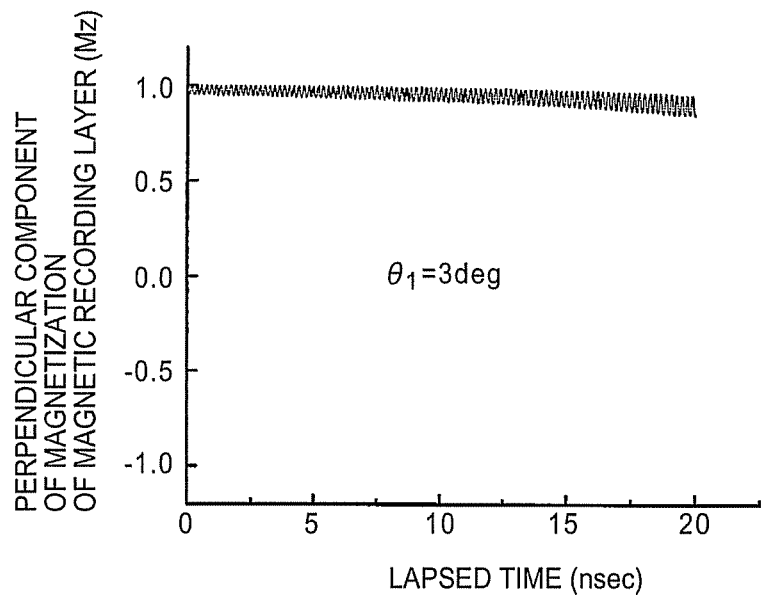
FIGS. 16A and 16B are graphs showing change in magnetization z-component of a third magnetic layer in lamination direction when passing a current by applying the voltage Vg (Vg>0V) between the third magnetic layer and an electrode.
Figure 16B:
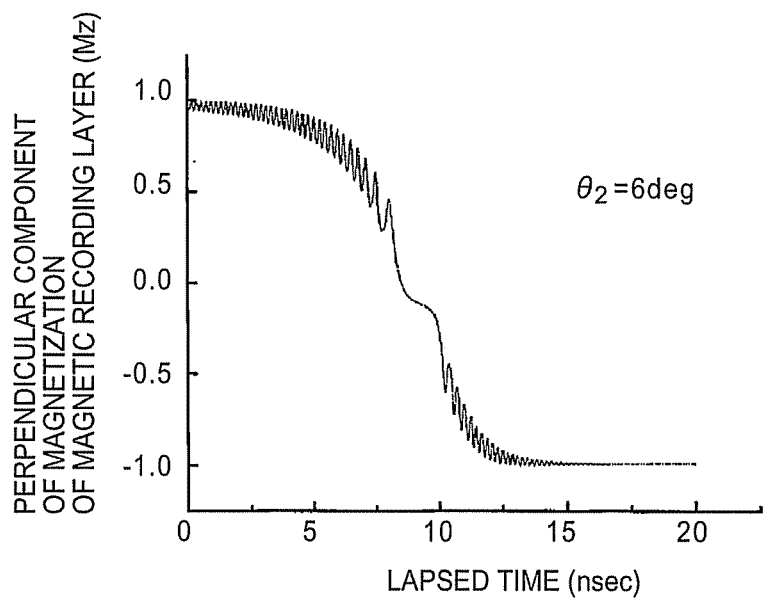

FIGS. 16A and 16B are graphs showing changes in the z-component magnetization of the third magnetic layer 30 when passing a current of $7 \times 10^6$ A/cm$^2$ while applying the voltage Vg (Vg>0V) between the third magnetic layer 30 and the electrode 70 so that the electrode 70 has higher electrical potential than the third magnetic layer 30. The horizontal and vertical axes denote lapsed time (ns) and the magnetization component of the third magnetic layer 30 in the lamination direction, respectively.

When 2.5V is applied to the electrode 70 to tilt the magnetization of the third magnetic layer 30 by 3° from the equilibrium condition, the magnetization of the second magnetic layer 20 is not reversed during 20 ns.

On the other hand, when 5V is applied to the electrode 70 to tilt the magnetization of the third magnetic layer 30 by 6° from the equilibrium condition, the magnetization of the second magnetic layer 20 is reversed at about 15 ns. It should be noted that the magnetization of the second magnetic layer 20 is reversed by applying a voltage to the third magnetic layer 30. The magnetization of the second magnetic layer 20 can be easily reversed by increasing the voltage applied to the electrode 70.

Third Embodiment

Figure 17:
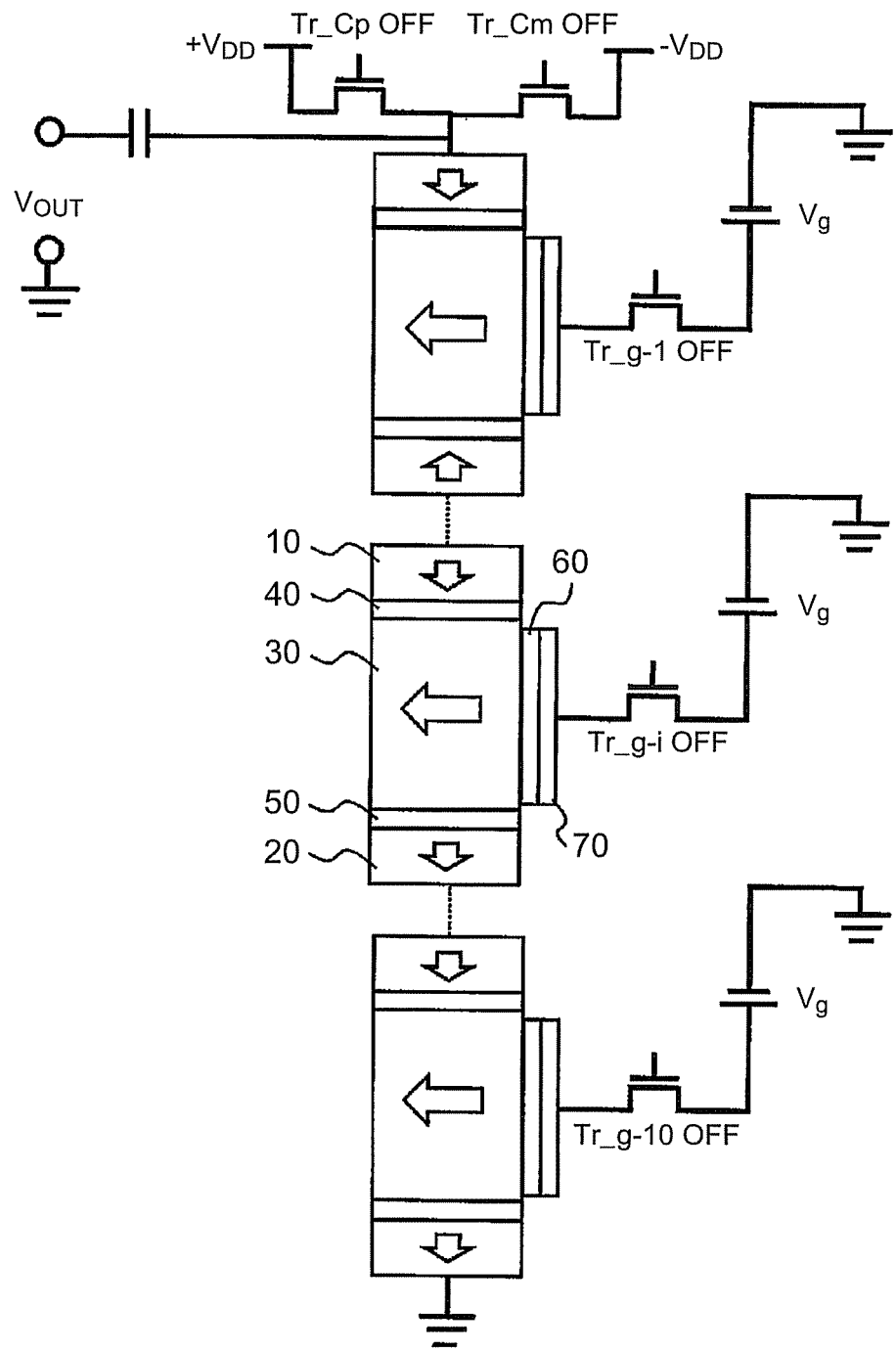
FIG. 17 is a view showing a configuration of a magnetic memory apparatus in accordance with a third embodiment.

An operation principle of the magnetic memory apparatus 200 with two or more magnetic memories 100 connected in series will be explained. For explanation, the number of the magnetic memories 100 is confined to 10. FIG. 17 is a view showing a configuration of the magnetic memory apparatus 200 as an example. The first magnetic layer 10 of the first magnetic memory 100 is connected to a transistor Tr_Cp, a transistor Tr_Cm, and a capacitor terminal. The transistor Tr_Cp switches on and off a positive current. The transistor Tr_Cm switches on and off a negative current. The capacitor terminal is to read information stored in the magnetic memory 100. Transistors Tr_g1 to Tr_g10 are connected to the respective magnetic memories 100. The common terminal of an external circuit is connected to the second magnetic layer 20 of the 10th magnetic memory 100. Data stored in the magnetic memory 100 is identified as '1' if the magnetization of the second magnetic layer 20 is upward, and '0' if the magnetization of the second magnetic layer 20 is downward. The respective magnetization directions of the first magnetic layer 10, the second magnetic layer 20, and the third magnetic layer 30 are as shown in FIG. 17.

At first, writing operation will be explained below.

Writing operation to each magnetic memory 100 is performed by passing a current therethrough and applying a voltage thereto. Writing operation is performed selectively to a specific magnetic memory 100 in which a voltage Vg (Vg>0V) is applied between the third magnetic layer 30 and the electrode 70 so that the electrode 70 has higher electrical potential than the third magnetic layer 30. The information, will be stored in second magnetic layer 20, is determined by the direction of the current to be passed through the selected magnetic memory 100.

When the transistor Tr_Cp is switched on to pass a positive current through the first to 10th magnetic memories 100, magnetization reversal occurs on the second magnetic layer 20 of specific magnetic memory 100 having data '0', where the voltage Vg is applied to electrode 70. That is, the positive current changes the data '0' of the specific magnetic memory 100 into data '1'. On the other hand, when the transistor Tr_Cm is switched on to pass a negative current through the first to 10th magnetic memories 100, magnetization reversal occurs on the second magnetic layer 20 of another specific magnetic memory 100 having data '1' where the voltage Vg is applied to electrode 70. That is, the negative current changes the data '1' of the specific magnetic memory 100 into data '0'.

Figure 18A:
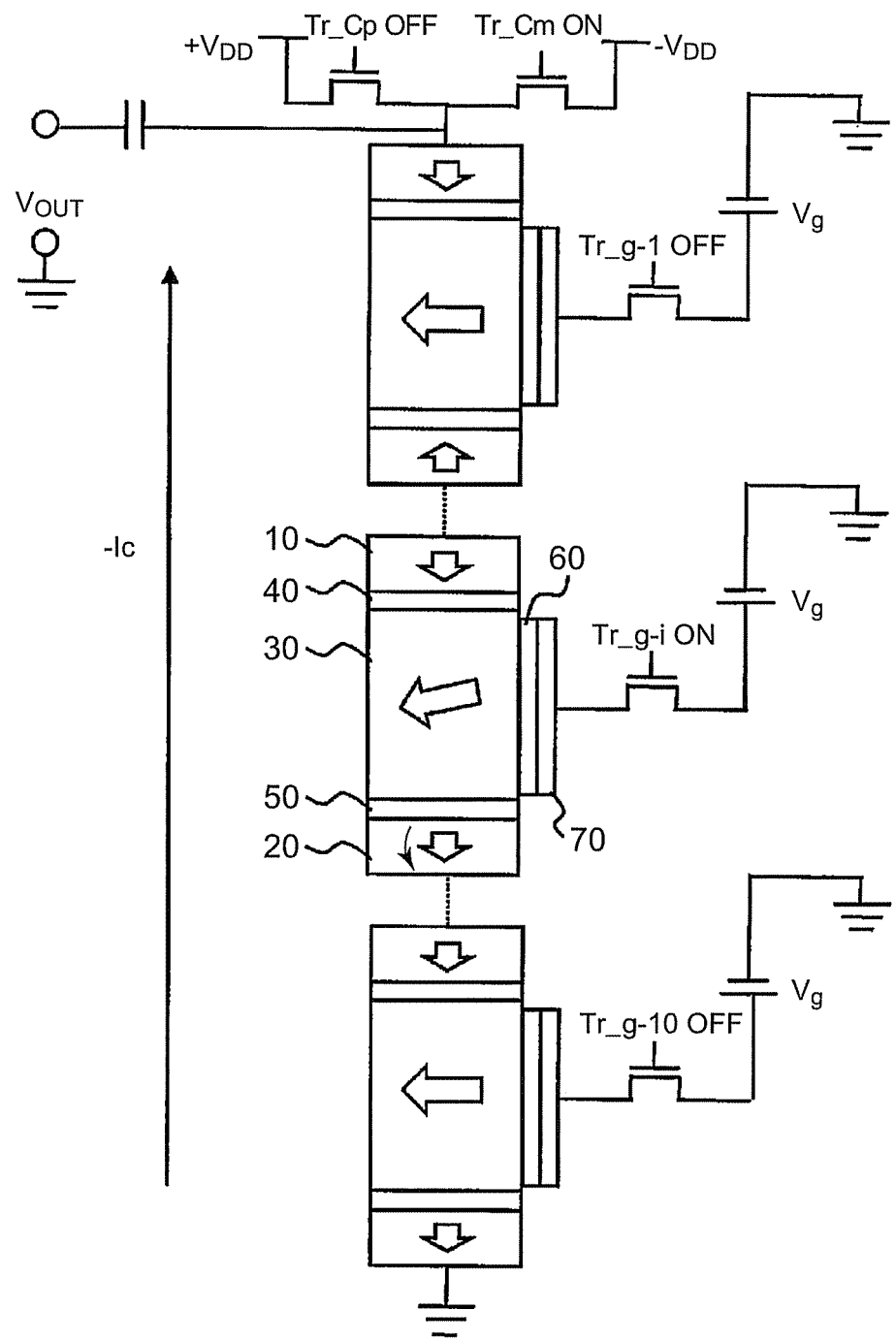
FIG. 18A is a schematic view showing the magnetic memory apparatus in accordance with the third embodiment.
Figure 18B:
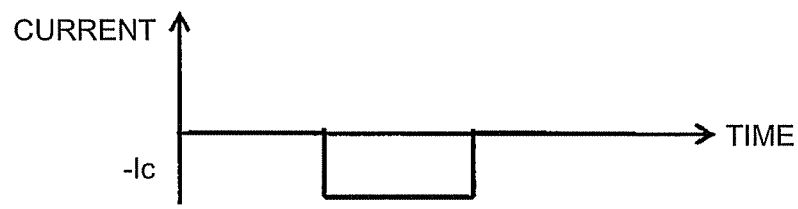
FIG. 18B schematically shows timing to apply voltage in the magnetic memory apparatus in accordance with the third embodiment.
Figure 18B:
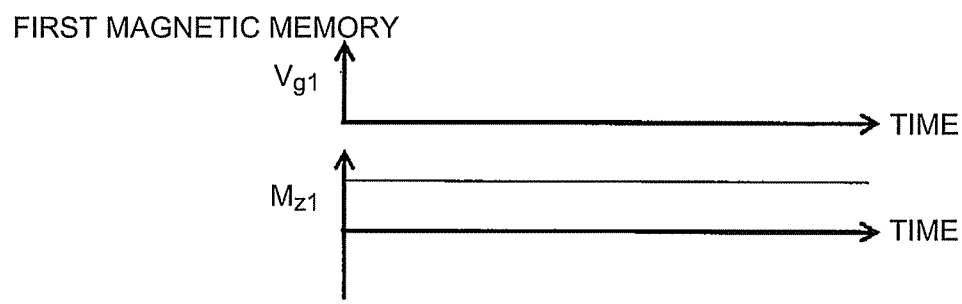
Figure 18B:
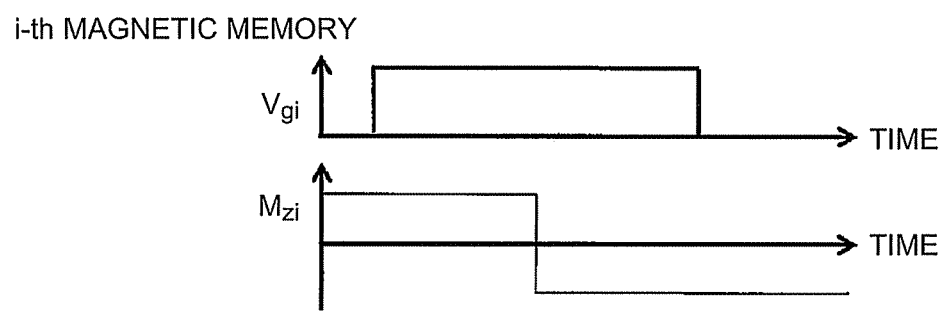
Figure 18B:
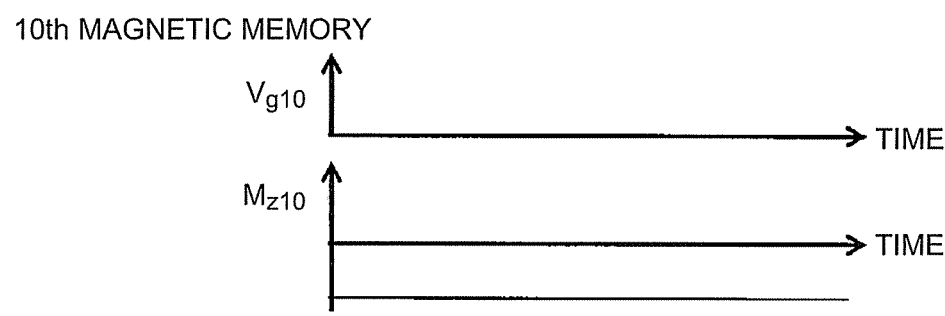

In FIGS. 18A and 18B, the voltage is applied to the electrode 70 of the i-th magnetic memory with the transistor Tr_Cm switched on to pass a negative current −Ic (Ic>0) for rewriting the data '1' of the i-th magnetic memory 100 to data '0'. FIG. 18A is a schematic view showing the magnetic memory apparatus 200. FIG. 18B schematically shows timing to apply the voltage.

Figure 19A:
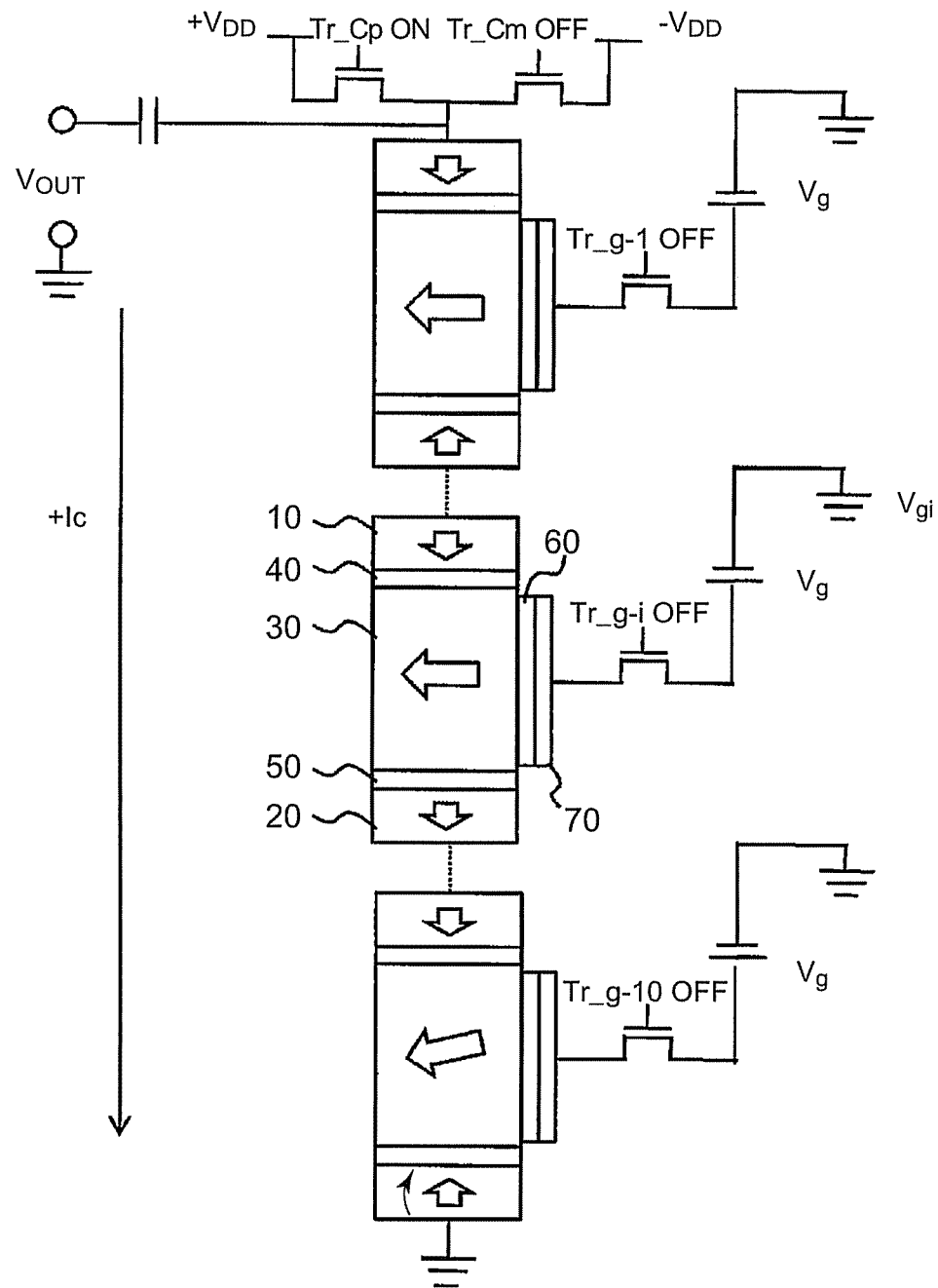
FIG. 19A is a schematic view showing the magnetic memory apparatus in accordance with the third embodiment.
Figure 19B:
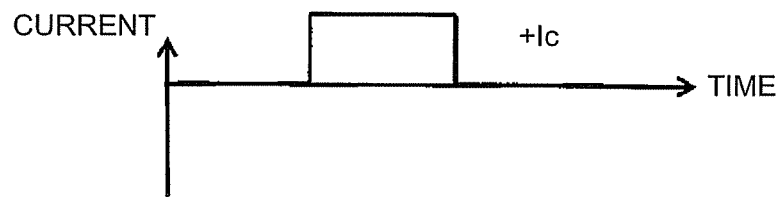
FIG. 19B schematically shows timing to apply voltage in the magnetic memory apparatus in accordance with the third embodiment.
Figure 19B:
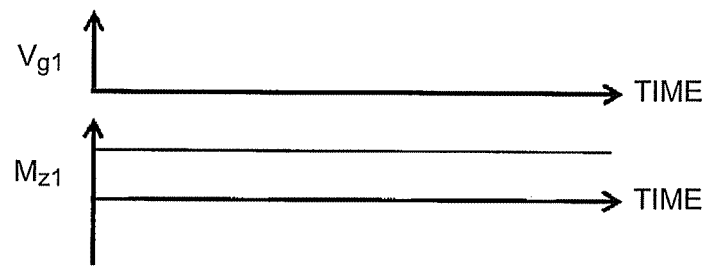
Figure 19B:
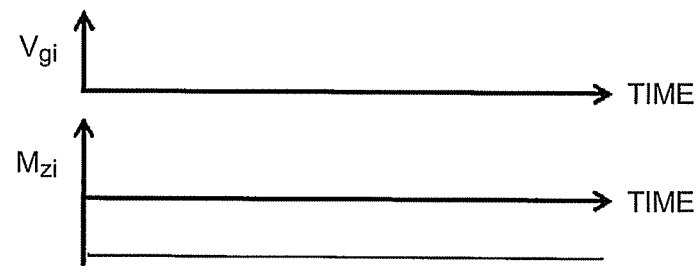
Figure 19B:
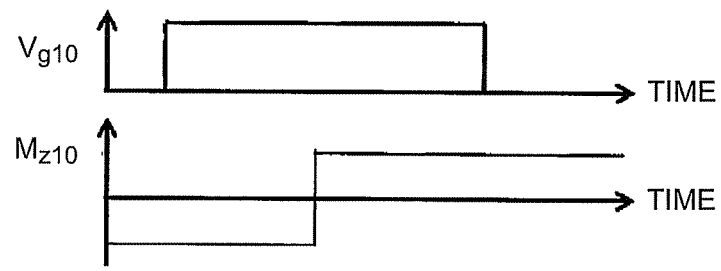

In FIGS. 19A and 19B, the voltage is applied to the electrode 70 of the 10th magnetic memory with the transistor Tr_Cp switched on to pass a positive current Ic (Ic>0) for rewriting the data '0' of the i-th magnetic memory 100 to data '1'. FIG. 19A is a schematic view showing the magnetic memory apparatus 200. FIG. 19B schematically shows timing to apply the voltage.

Next, reading operation will be explained.

Figure 20A:
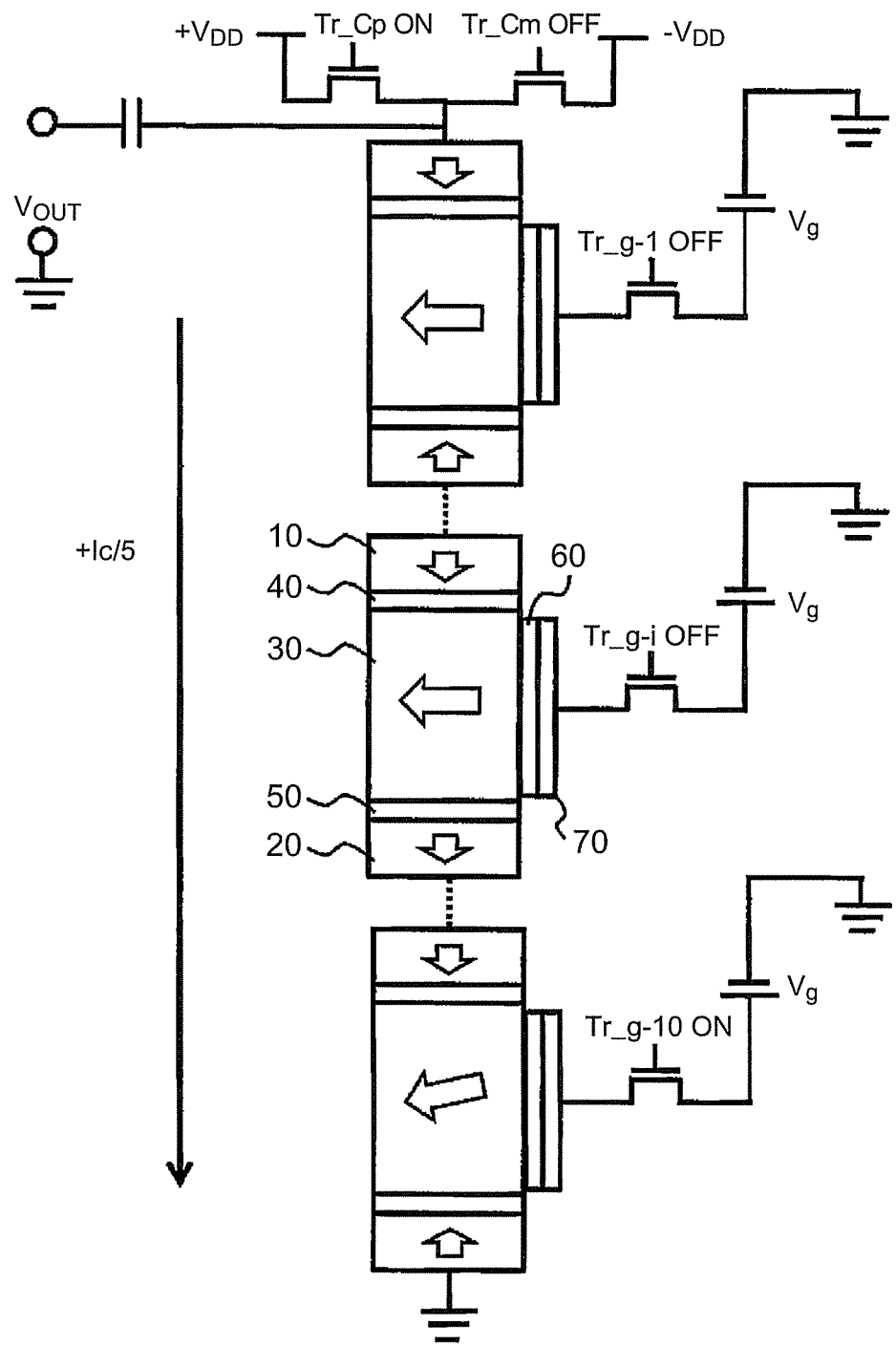
FIG. 20A is a view showing write to the magnetic memory apparatus in accordance with the third embodiment.
Figure 20B:
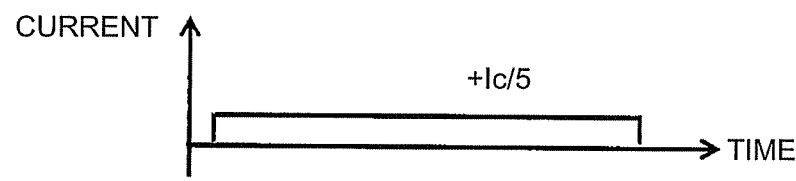
FIG. 20B schematically shows timing to apply voltage in the magnetic memory apparatus in accordance with the third embodiment.
Figure 20B:
Figure 20B:
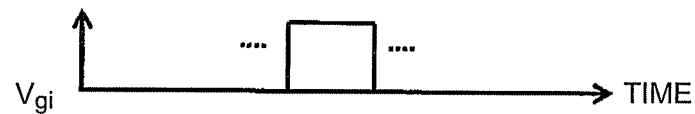
Figure 20B:
Figure 20B:
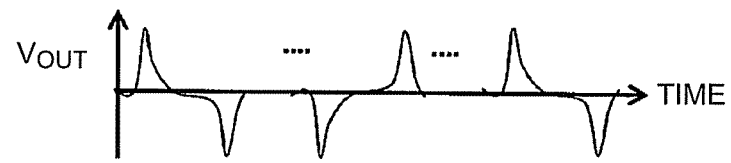

Reading operation of the magnetic memory apparatus 200 is performed in the following manner. The voltage Vg is applied to the respective electrodes 70 of the magnetic memories 100 in descending order, i.e., from the first magnetic memory 100 to the tenth magnetic memory 100 to detect whether the respective resistance changes of the magnetic memories 100 are positive or negative. For example, the positive resistance change indicates the data '1' recorded in the magnetic memory 100 and the negative resistance change indicates the data '0' recorded therein. The current value to be passed through the magnetic memory 100 for reading operation should be smaller than a current value for writing operation. Alternatively, a voltage reverse to a writing voltage may be applied for reading operation. In other word, when a positive voltage is applied for writing operation, a reading voltage may be set to negative. The resistance change may be read out directly, while the resistance change may be read out providing a capacity junction as shown in FIG. 20A. For this operation, a voltage pulse is applied to each electrode 70 to cause a temporal change in the magnetization of the third magnetic layer 30. The temporal change causes a voltage drop of which differential signal enables it to read data stored in the magnetic memory 100.

The first to third embodiments have been explained, provided that the magnetization of the first magnetic layer 10 and the magnetization of the third magnetic layer 30 are fixed, while the magnetization of the second magnetic layer 20 is weakly fixed as compared therewith. In the view point of both reading and writing operations, a different characteristic of the magnetic memory 100, in which the magnetization of the first magnetic layer 10 and the magnetization of the second magnetic layer 20 is fixed, while the magnetization of the third magnetic layer 20 is weakly fixed as compared therewith, is also acceptable.

While a certain embodiment of the invention has been described, the embodiment has been presented by way of examples only, and is not intended to limit the scope of the inventions. Indeed, the novel elements and apparatuses described herein may be embodied in a variety of other forms; furthermore, various omissions, substitutions and changes in the form of the methods described herein may be made without departing from the spirit of the invention. The accompanying claims and their equivalents are intended to cover such forms or modifications as would fall within the scope and spirit of the invention.

What is claimed is:

1. A magnetic memory comprising:
a first magnetic layer;
a second magnetic layer;
a third magnetic layer provided between the first magnetic layer and the second magnetic layer in a first direction being perpendicular to the plane of both the first magnetic layer and the second magnetic layer;
a first intermediate layer provided between the first magnetic layer and the third magnetic layer;
a second intermediate layer provided between the second magnetic layer and the third magnetic layer;
an insulator layer provided on the third magnetic layer in a second direction perpendicular to the first direction; and
an electrode provided on the insulator layer so that the insulator is sandwiched between the third magnetic layer and the electrode in the second direction,
wherein
a positive voltage is applied to the electrode and a first current passes from the first magnetic layer to the second magnetic layer, thereby writing information to the second magnetic layer.

2. The memory according to claim 1, wherein
a negative voltage is applied to the electrode and the first current passes from the first magnetic layer to the second magnetic layer or a positive voltage is applied to the electrode and a second current passes from the first magnetic layer to the second magnetic layer, the second current being smaller than the first current, reading information stored in the second magnetic layer by passage of the first current or the second current from the first magnetic layer to the second magnetic layer.

3. A magnetic memory comprising:
a first magnetic layer;
a second magnetic layer;
a third magnetic layer provided between the first magnetic layer and the second magnetic layer in a first direction being perpendicular to the plane of both the first magnetic layer and the second magnetic layer;
a first intermediate layer provided between the first magnetic layer and the third magnetic layer;
a second intermediate layer provided between the second magnetic layer and the third magnetic layer;
an insulator layer provided on the third magnetic layer in a second direction perpendicular to the first direction; and
an electrode provided on the insulator layer so that the insulator is sandwiched between the third magnetic layer and the electrode in the second direction,
wherein
voltage is applied to the electrode and a current passes from the first magnetic layer to the second magnetic layer, thereby reading information stored in the second magnetic layer.

4. A magnetic memory comprising:
a first magnetic layer;
a second magnetic layer;
a third magnetic layer provided between the first magnetic layer and the second magnetic layer in a first direction being perpendicular to the plane of both the first magnetic layer and the second magnetic layer;
a first intermediate layer provided between the first magnetic layer and the third magnetic layer;
a second intermediate layer provided between the second magnetic layer and the third magnetic layer;
an insulator film provided on the third magnetic layer in a second direction perpendicular to the first direction; and an electrode provided on the insulator film so that the insulator is sandwiched between the third magnetic layer and the electrode in the second direction.

5. The memory according to claim 4, wherein
magnetization of the first magnetic layer is oriented in the first direction;
a magnetization direction of the second magnetic layer is variable and is oriented in the first direction; and
magnetization of the third magnetic layer is oriented in a direction perpendicular to the first direction.

6. The memory according to claim 4, wherein
magnetization of the first magnetic layer is oriented in a second direction perpendicular to the first direction;
a magnetization direction of the second magnetic layer is variable and is oriented in the first direction; and
magnetization of the third magnetic layer is fixed in the first direction.

7. The memory according to claim 6, wherein
the first magnetic layer, the second magnetic layer and the third magnetic layer have <0001> orientation of a hexagonal close-packed structure or <111> orientation of a face centered cubic structure.

8. The memory according to claim 4, wherein
a dumping factor of the third magnetic layer is larger than the dumping factor of the second magnetic layer.

9. The memory according to claim 4, further comprising:
an insulator sandwiching both the insulator layer and the electrode in the first direction, and sandwiching the first magnetic layer, the second magnetic layer, the third magnetic layer, the first intermediate layer, and the second intermediate layer in the second direction,
wherein
a permittivity of the insulator layer is higher than the permittivity of the insulator.

10. A magnetic memory apparatus comprising:
a first interconnection and a second interconnection, both being in a direction; and
a magnetic memory disposed between the first interconnection and the second interconnection,
wherein
the magnetic memory includes:
a first magnetic layer;
a second magnetic layer;
a third magnetic layer provided between the first magnetic layer and the second magnetic layer in a first direction being perpendicular to a plane of both the first magnetic layer and the second magnetic layer;
a first intermediate layer provided between the first magnetic layer and the third magnetic layer;
a second intermediate layer provided between the second magnetic layer and the third magnetic layer;
an insulator film provided on the third magnetic layer in a second direction perpendicular to the first direction; and
an electrode provided on the insulator film so that the insulator is sandwiched between the third magnetic layer and the electrode in the second direction.

* * * * *